(12) United States Patent
Hasegawa et al.

(10) Patent No.: US 8,691,364 B2
(45) Date of Patent: Apr. 8, 2014

(54) LAMINATE, AND POLISHING MATERIAL AND GRINDING MATERIAL USING THE SAME, AND METHOD FOR PRODUCING THE LAMINATE

(75) Inventors: Masataka Hasegawa, Ibaraki (JP); Kazuo Tsugawa, Ibaraki (JP); Masatou Ishihara, Ibaraki (JP); Yoshinori Koga, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 596 days.

(21) Appl. No.: 12/445,210

(22) PCT Filed: Oct. 12, 2007

(86) PCT No.: PCT/JP2007/069999
§ 371 (c)(1),
(2), (4) Date: Apr. 10, 2009

(87) PCT Pub. No.: WO2008/047728
PCT Pub. Date: Apr. 24, 2008

(65) Prior Publication Data
US 2010/0092728 A1    Apr. 15, 2010

(30) Foreign Application Priority Data
Oct. 13, 2006  (JP) .............................. P. 2006-279814

(51) Int. Cl.
*B24D 3/00*    (2006.01)

(52) U.S. Cl.
USPC ............... 428/143; 428/408; 51/307; 51/308; 51/309

(58) Field of Classification Search
USPC ................................................. 428/143, 408
See application file for complete search history.

(56) References Cited

U.S. PATENT DOCUMENTS

| | | |
|---|---|---|
| 5,551,959 A | 9/1996 | Martin et al. |
| 5,707,409 A | 1/1998 | Martin et al. |

(Continued)

FOREIGN PATENT DOCUMENTS

| | | |
|---|---|---|
| EP | 0 884 770 A1 | 12/1998 |
| EP | 1 748 091 A1 | 1/2007 |

(Continued)

OTHER PUBLICATIONS

Tsugawa et al. (Nanocrystal diamond large area film formation on a glass substrate, New Diamond, vol. 20 No. 2 (2004) pp. 16-17) and translation.*

(Continued)

*Primary Examiner* — Maria Veronica Ewald
*Assistant Examiner* — Laura Auer
(74) *Attorney, Agent, or Firm* — Morgan, Lewis & Bockius LLP

(57) ABSTRACT

The invention provides a laminate capable of polishing and grinding the surface of a material having a high hardness such as diamond, sapphire or hard carbon film, rapidly and in a simplified manner with high planarity and high accuracy, utilizing the high adhesiveness to substrates, the hardness and the surface planarity that a carbon film has, but using neither diamond abrasive grains nor alkali slurry. The laminate comprises a substrate and a carbon layer provided on the substrate, wherein the carbon layer comprises a diamond fine grain provided on the substrate and crushed by impact given thereto, a formation/growth inhibiting material that inhibits the formation of an impurity inhibiting the growth of a carbon grain and/or inhibits the growth of a carbon grain, and a carbon grain, and an amount (amount per unit volume) of the formation/growth inhibiting material decreases from a lower layer toward an upper layer on the substrate side. Preferably, the formation/growth inhibiting material is an $SiO_2$ material or an $Al_2O_3$ material, and optionally an adhesiveness-reinforcing layer comprising titanium or a titanium alloy or the like may be provided between the substrate and the carbon layer.

8 Claims, 14 Drawing Sheets

(56) References Cited

U.S. PATENT DOCUMENTS

2007/0172660 A1* 7/2007 Koga et al. .................. 428/408
2009/0226718 A1* 9/2009 Hasegawa et al. ........... 428/338

FOREIGN PATENT DOCUMENTS

| | | |
|---|---|---|
| JP | 10-504495 | 5/1998 |
| JP | 11-80962 | 3/1999 |
| JP | 2003-159653 | 6/2003 |
| WO | WO 2005/103326 | 4/2005 |
| WO | 2007/004647 A1 | 1/2007 |

OTHER PUBLICATIONS

Borges et al. (Silicon contamination of diamond films deposited on silicon substrates in fused silica based reactors, J. Appl. Phys. 79(6), Mar. 1996, pp. 3290-3298).*
Extended European Search Report dated Sep. 12, 2012 for the corresponding EP application 07829735.5.
Japanese Office Action dated Dec. 20, 2011 for the corresponding application JP 2008-539795.
Japanese Office Action dated Sep. 26, 2012 for the corresponding JP application 2008-539795.
Japanese Office Action dated Jun. 19, 2013 in the corresponding Japanese Patent Application No. JP2012-033873.

* cited by examiner

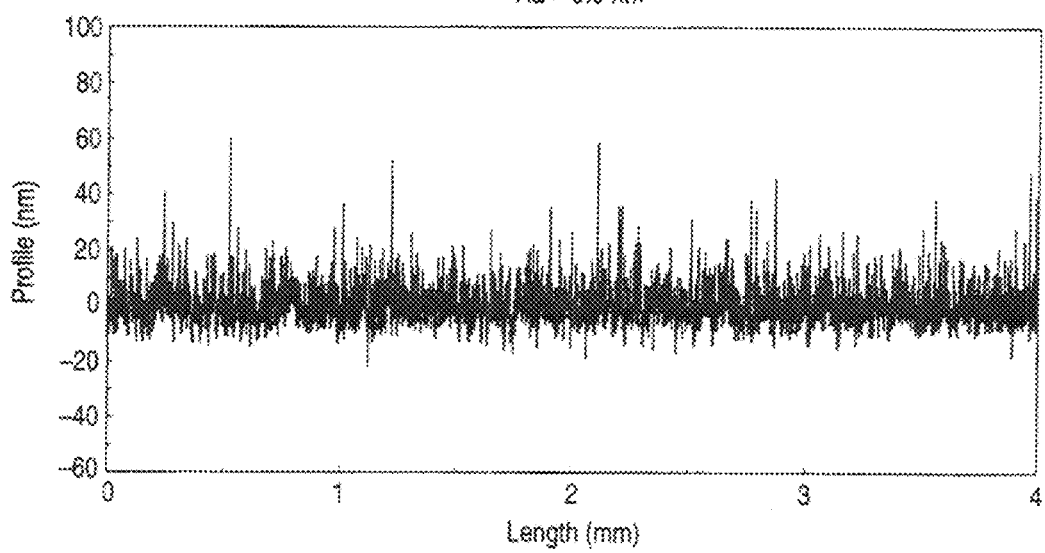
FIG. 22
*FIG. 23A*  *FIG. 23B*
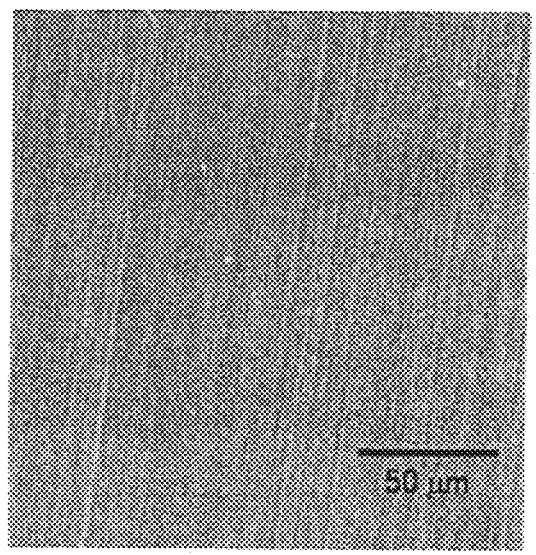
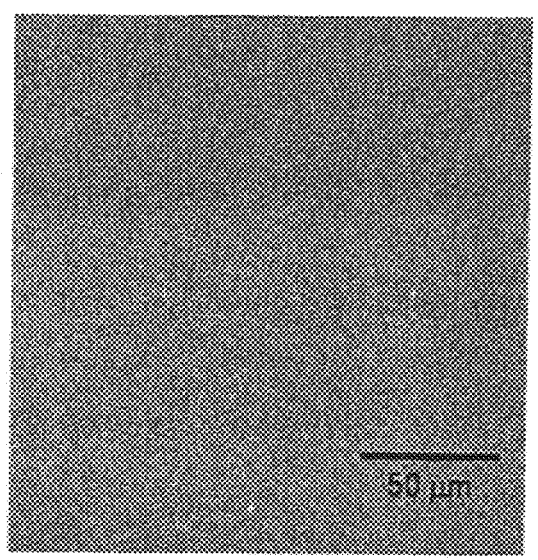

FIG. 24A
FIG. 24B
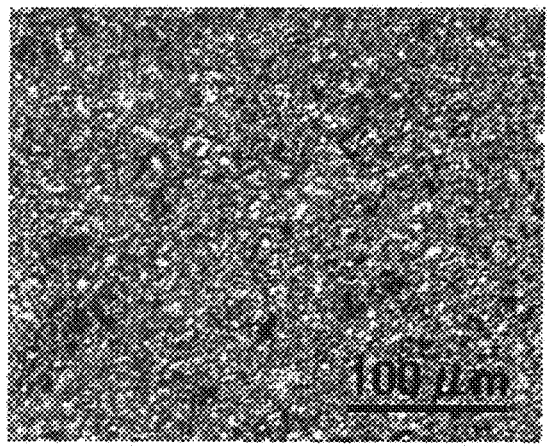
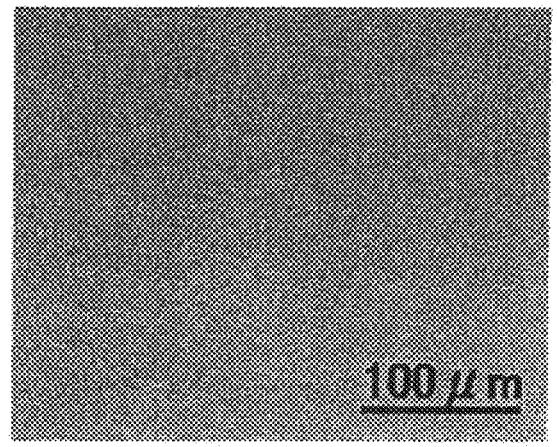

LAMINATE, AND POLISHING MATERIAL AND GRINDING MATERIAL USING THE SAME, AND METHOD FOR PRODUCING THE LAMINATE

CROSS-REFERENCE TO RELATED APPLICATIONS

The present application is a U.S. National Phase Application of International Application PCT/JP2007/069999, filed Oct. 12, 2007, which claims priority to Japanese Application No. JP 2006-279814, file on Oct. 13, 2006, all of which are herein incorporated by reference in their entirety.

TECHNICAL FIELD

The present invention relates to a laminate comprising at least a carbon layer provided on a substrate, in particular to a laminate effective for a polishing material, in which the carbon layer provided on the substrate has a high hardness and a planar surface.

BACKGROUND ART

In various fields, recently, a hard substrate surface of diamond single crystal, sapphire single crystal or the like is required to have high-level specularity and planarity.

For example, in case where diamond is used in the heat sink or the like in surface acoustic wave devices, semiconductor devices and other various devices, the diamond is required to have much more high-level specularity and planarity than before, for example, having a surface roughness in the order of nanometer or less. To satisfy the requirement, it is indispensable to develop a polishing method on a higher level for the surface of diamond single crystal.

Heretofore, for polishing the surface of diamond, mainly employed is a mechanical method. The mechanical method includes, for example, scaife polishing that comprises roughly grinding the rough surface of diamond by a physical means with a grinding machine or the like, then polishing it with diamond abrasive grains, and further melting the diamond ingredient in the rough part through high-temperature high-speed friction to thereby planarize the diamond surface.

For obtaining a desired degree of planarity in such mechanical polishing, it is necessary to control the grain size of the abrasive grains of the polishing plate; however, since the grains themselves are diamond, their grain size control is difficult. For obtaining the final planarity, the process must comprise many steps where the grain size of the abrasive grains is gradually decreased from a large one, and this is an operation requiring great skill. Nonetheless the situation could not be said to attain the necessary planarity.

Recently, sapphire single crystal is used for the substrate of blue-light emitting diodes and blue laser diodes, on which a thin film of GaN, a thin film of InGaN or the like is formed through epitaxial growth. In order that sapphire single crystal is used as the substrate for such epitaxial growth thereon, its surface must be planar, requiring a surface planarity of 2 nm or less. Recently, in place of silicon wafers, sapphire wafers resistant to radiations have become used in ultra-LSI such as devices to be mounted on satellites. Sapphire as the ultra-LSI substrate is also required to have a surface roughness in the order of 2 nm, and recently, a surface planarity more than it is required.

Heretofore in final finish of a sapphire surface, "chemical-mechanical polishing" comprising nanometer-scale mechanical removing with ultrafine abrasive grains and chemical dissolution with processed liquid having an etching effect as combined could satisfy the necessary precision level. However, with higher integration of devices, further planarization is being required, and it is being difficult to satisfy the necessary precision level with such alkali slurry.

On the other hand, the present inventors have found that, when diamond fine grains are adhered to a substrate of glass, silicon, iron, titanium, copper, plastic or the like through ultrasonic treatment and a low-temperature surface wave plasma CVD method is applied thereto, then a carbon film of carbon grains having a grain size of from 2 to 30 nm densely deposited thereon is formed to have a thickness of 2 µm or more, and that the hardness of the carbon film is 20 GPa or more (see Patent Reference 1).

Patent Reference 1: WO2005/103326

DISCLOSURE OF THE INVENTION

Problems that the Invention is to Solve

The invention has been made in view of the above circumstances, and an object thereof is to provide a laminate capable of polishing and grinding the surface of a material having a high hardness such as diamond, sapphire or hard carbon film, rapidly and in a simplified manner with high planarity and high accuracy, utilizing the high adhesiveness to substrates, the hardness and the surface planarity that a carbon film has, but using neither diamond abrasive grains nor alkali slurry.

Means for Solving the Problems

The present inventors have made further assiduous studies about the above-mentioned laminate comprising a substrate and a carbon layer provided on the substrate, and as a result, have found that, when a formation/growth inhibiting material that inhibits the formation of impurities inhibiting the growth of the carbon grains and/or inhibits the growth of the carbon grains is used in addition to the diamond grains and carbon grains constituting the carbon layer, then a carbon layer can be formed having high adhesiveness to substrates, high hardness and good surface planarity and, as a result, a laminate can be thereby provided capable of polishing and grinding the surface of a material having a high hardness such as diamond, sapphire or hard carbon film, rapidly and in a simplified manner with high planarity and high accuracy.

The invention has been achieved on the basis of these findings, and is as follows.

(1) A laminate comprising a substrate and a carbon layer provided on the substrate, wherein the carbon layer comprises a diamond fine grain provided on the substrate and crushed by impact given thereto, a formation/growth inhibiting material that inhibits the formation of an impurity inhibiting the growth of a carbon grain and/or inhibits the growth of a carbon grain, and a carbon grain, and an amount of the formation/growth inhibiting material decreases from a lower layer toward an upper layer on the substrate side.

(2) A laminate comprising a substrate and a carbon layer provided on the substrate, wherein the carbon layer comprises a diamond fine grain provided on the substrate and crushed by impact given thereto, an $SiO_2$ material or $Al_2O_3$ material, and a carbon grain, and an amount of the $SiO_2$ material or $Al_2O_3$ material decreases from a lower layer toward an upper layer on the substrate side.

(3) The laminate according to (1) or (2), wherein the diamond fine grain crushed by impact given thereto comprises a diamond fine grain for anchor cutting into the substrate as a part thereof.

(4) The laminate according to any one of (1) to (3), wherein the diamond fine grain crushed by impact given thereto comprises a diamond fine grain for reinforcing adhesiveness between the substrate and the carbon layer as a part thereof.

(5) The laminate according to any one of (1) to (4), wherein the substrate comprises any one of glass, silicon, iron, an iron-base alloy, a stainless and a plastic.

(6) A laminate comprising a substrate, an adhesiveness-reinforcing layer provided on the substrate and a carbon layer provided on the adhesiveness-reinforcing layer, wherein the carbon layer comprises a diamond fine grain provided on the adhesiveness-reinforcing layer and crushed by impact given thereto, a formation/growth inhibiting material that inhibits the formation of an impurity inhibiting the growth of a carbon grain and/or inhibits the growth of a carbon grain, and a carbon grain, and an amount of the formation/growth inhibiting material decreases from a lower layer toward an upper layer on the substrate side.

(7) A laminate comprising a substrate, an adhesiveness-reinforcing layer provided on the substrate and a carbon layer provided on the adhesiveness-reinforcing layer the substrate, wherein the carbon layer comprises a diamond fine grain provided on the adhesiveness-reinforcing layer and crushed by impact given thereto, an $SiO_2$ material or $Al_2O_3$, and a carbon grain, and an amount of the $SiO_2$ material or $Al_2O_3$ decreases from a lower layer toward an upper layer on the substrate side.

(8) The laminate according to (6) or (7), wherein the diamond fine grain crushed by impact given thereto comprises a diamond fine grain for anchor cutting into the adhesiveness-reinforcing layer as a part thereof.

(9) The laminate according to any one of (6) to (8), wherein the diamond fine grain crushed by impact given thereto comprises a diamond fine grain for reinforcing adhesiveness between the adhesiveness-reinforcing layer and the carbon layer as a part thereof.

(10) The laminate according to any one of (6) to (9), wherein the adhesiveness-reinforcing layer is any of titanium and a titanium alloy.

(11) The laminate according to any one of (6) to (10), wherein the substrate comprises any one of glass, silicon, aluminium, iron, an iron-base alloy, a stainless and a plastic.

(12) The laminate according to any one of (1) to (11), wherein the diamond fine grain is one crushed by giving impact to a diamond grain having a grain size of from 4 nm to 100 nm to have a grain size of from 1 nm to 50 nm.

(13) The laminate according to any one of (1) to (12), wherein a density of the diamond fine grain provided on the substrate or the adhesiveness-reinforcing layer is from $1\times10^9$ grains/cm$^2$ to $1\times10^{12}$ grains/cm$^2$.

(14) The laminate according to any one of (1) to (13), wherein the carbon grain includes at least 70 atomic % or more of the carbon layer in 80 nm or more from a lower layer on the side of the substrate or the adhesiveness-reinforcing layer.

(15) The laminate according to any one of (1) to (14), wherein the carbon layer has a spectrum peak at a Bragg's angle ($2\theta\pm0.3°$) of from 41° to 42° in an X-ray diffraction spectrum with $CuK_{\alpha1}$ ray.

(16) The laminate according to any one of (1) to (15), wherein the carbon layer is a diamond film or a diamond-like carbon film.

(17) A polishing material comprising the laminate according to any one of (1) to (16), wherein an outermost surface of the carbon layer has a surface roughness Ra of from 4 to 11 nm, and a region where the carbon grain accounts for 70% or more of the carbon layer is a polishing layer.

(18) A grinding material comprising the laminate according to any one of (1) to (16), wherein an outermost surface of the carbon layer has a surface roughness Ra of from 4 to 11 nm, and a region where the carbon grain accounts for 70% or more of the carbon layer is a grinding layer.

(19) A method for producing a laminate comprising:
preparing a substrate;
crushing a diamond fine grain to provide the diamond fine grain on the substrate; and
introducing a reaction gas into a microwave plasma CVD reactor where a supply source of an $SiO_2$ material or $Al_2O_3$ material and the substrate prepared in the previous step are placed therein, generating a surface wave plasma in the reactor, and depositing a film comprising the $SiO_2$ material or $Al_2O_3$ material and a carbon grain on the substrate so as to decrease an amount of the $SiO_2$ material or $Al_2O_3$ material from a lower layer toward an upper layer on the substrate side.

(20) A method for producing a laminate comprising:
preparing a substrate;
forming an adhesiveness-reinforcing layer on the substrate;
crushing a diamond fine grain to provide the diamond fine grain on the adhesiveness-reinforcing layer; and
introducing a reaction gas into a microwave plasma CVD reactor where a supply source of an $SiO_2$ material or $Al_2O_3$ material and the substrate prepared in the previous step are placed therein, generating a surface wave plasma in the reactor, and depositing a film comprising the $SiO_2$ material or $Al_2O_3$ material and a carbon grain on the adhesiveness-reinforcing layer so as to decrease an amount of the $SiO_2$ material or $Al_2O_3$ material from a lower layer toward an upper layer on the adhesiveness-reinforcing layer side.

(21) The method for producing a laminate according to (19) or (20), wherein the supply source of the $SiO_2$ material or $Al_2O_3$ material serves also as a member constituting the microwave reactor.

(22) The method for producing a laminate according to any one of (19) to (21), wherein the deposition step comprises: placing the substrate prepared in the previous step at a position at which an electron temperature of the plasma is from 0.5 to 3.0 eV in the microwave plasma CVD reactor into which a mixed gas of a carbon-containing gas, an argon gas and/or a hydrogen gas is introduced as the reaction gas and in which the plasma is generated under a gas pressure of from 1 to 100 pascals; and moving a radical particle in the plasma from a generation source of the plasma in the reactor toward the substrate or the adhesiveness-reinforcing layer such that the radical particle almost uniformly reach on the surface of the substrate or the adhesiveness-reinforcing layer.

(23) The method for producing a laminate according to any one of (19) to (22), wherein the step of providing the diamond fine grain comprises: preparing a diamond grain having a grain size of from 4 nm to 100 nm to which impact is given; giving impact to the diamond grain by an ultrasonic wave to grind; and making the crushed diamond fine grain cut into the substrate or the adhesiveness-reinforcing layer as a part thereof.

(24) A method for producing a polishing material, comprising:
preparing a substrate;
crushing a diamond fine grain to provide the diamond fine grain on the substrate;
introducing a reaction gas into a microwave plasma CVD reactor where a supply source of an $SiO_2$ material or $Al_2O_3$ material and the substrate prepared in the previous step are placed therein, generating a surface wave plasma in the reactor, and depositing a film comprising the $SiO_2$ material or Al$_2$O$_3$ material and a carbon grain on the substrate so as to decrease an amount of the SiO$_2$ material or Al$_2$O$_3$ material from a lower layer toward an upper layer on the substrate side; and exposing a surface of the deposited film to a hydrogen plasma to control a roughness of the surface.

Advantage of the Invention

The laminate of the invention has high adhesiveness to substrates, high hardness and good surface planarity that the carbon layer thereof has. Accordingly, using the laminate of the invention but not using diamond abrasive grains, alkali slurry or the like, it is possible to provide a polishing material or grinding material capable of polishing or grinding the surface of a material having a high hardness such as diamond, sapphire or hard carbon film, rapidly and in a simplified manner with high planarity and high accuracy.

BRIEF DESCRIPTION OF THE DRAWINGS

FIG. 22 It is a view showing the measurement data of the surface configuration of a laminate of the invention exposed to hydrogen plasma after CVD treatment.

FIG. 23A and FIG. 23B It is the surface of a single crystal diamond substrate before polished (FIG. 23A) and after polished (FIG. 23B) with a laminate of the invention, as observed with an optical microscope.

FIG. 24A and FIG. 24B It is the surface of a single crystal sapphire substrate before polished (FIG. 24A) and after polished (FIG. 24B) with a laminate of the invention, as observed with an optical microscope.

EXPLANATION OF REFERENCE

Figure 1:
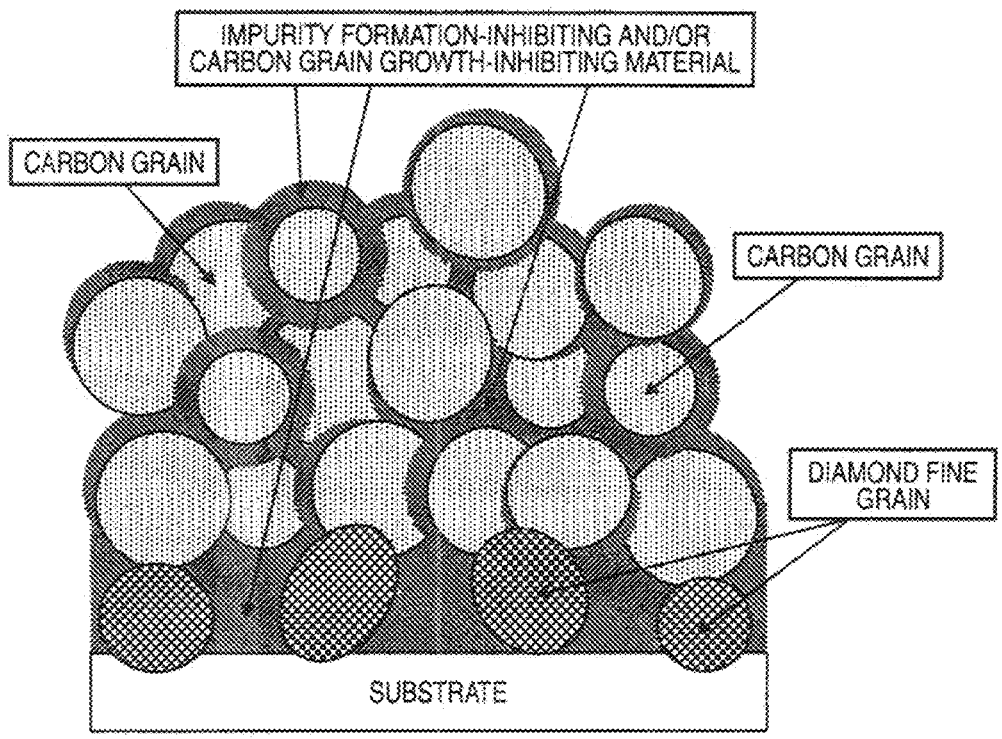
FIG. 1 It is a view showing a laminate structure of a laminate of the invention.
Figure 2:
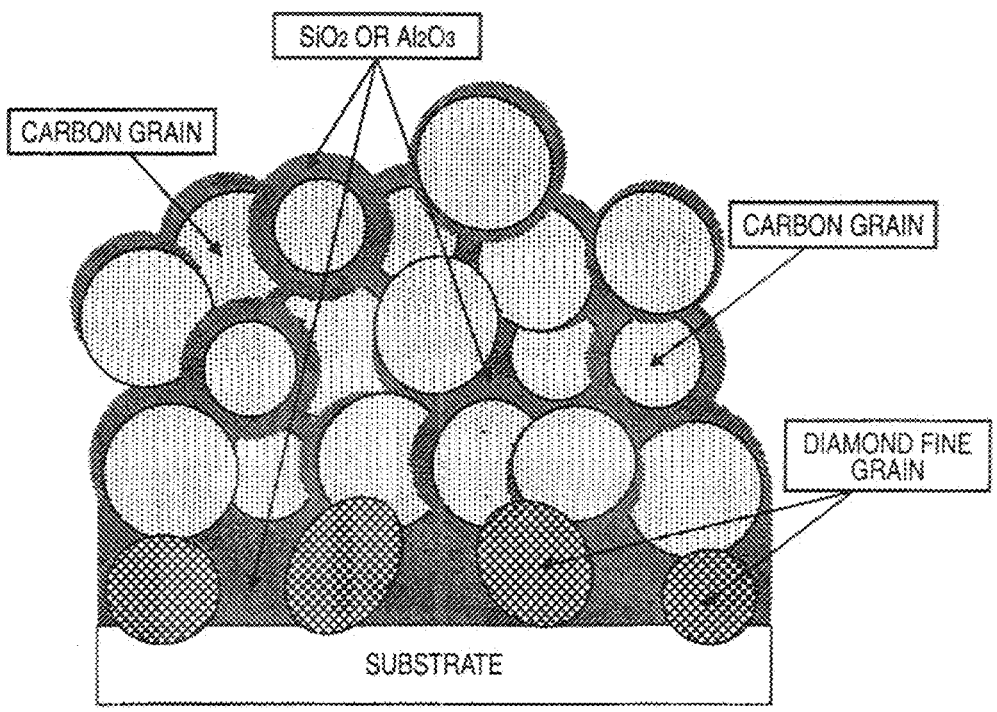
FIG. 2 It is a view showing a laminate structure of a laminate of the invention.

101 Plasma generating chamber
102 Slotted square waveguide tube
103 Quartz member for introducing microwave
104 Metal-made supporting frame for supporting quartz window
105 Substrate for film formation thereon
106 Sample holder for placing a substrate for film formation thereon
107 Supply and drain of cooling water
108 Evacuation
109 Pipe for introducing gas for plasma generation
110 Reactor

BEST MODE FOR CARRYING OUT THE INVENTION

FIG. 1 to FIG. 4 are cross-sectional views showing an outline of the substrate and therearound of the laminate of the invention.

The laminate of the invention comprises a substrate and a carbon layer provided on the substrate, wherein the carbon layer comprises a diamond fine grain provided on the substrate and crushed by impact given thereto, a formation/growth inhibiting material that inhibits the formation of an impurity inhibiting the growth of a carbon grain and/or inhibits the growth of a carbon grain, and a carbon grain, and an amount (amount per unit volume) of the formation/growth inhibiting material decreases from a lower layer toward an upper layer on the substrate side; and this has a laminate structure as in FIG. 1. In the invention, "an impurity inhibiting the growth of a carbon grain" corresponds to amorphous carbon, graphite or the like which is formed in the grain boundary of carbon grains and/or in the space between carbon grains along with the growth of carbon grains.

Concretely, the carbon layer comprises a diamond fine grain provided on the substrate and crushed by impact given thereto, an $SiO_2$ material or $Al_2O_3$ material, and a carbon grain, and an amount (amount per unit volume) of the $SiO_2$ material or $Al_2O_3$ material decreases from a lower layer toward an upper layer on the substrate side. In the laminate, one has 70 atomic % or more of the carbon grains in 80 nm or more from the lower layer on the side of the substrate, as in the laminate structure shown in FIG. 2.

Figure 3:
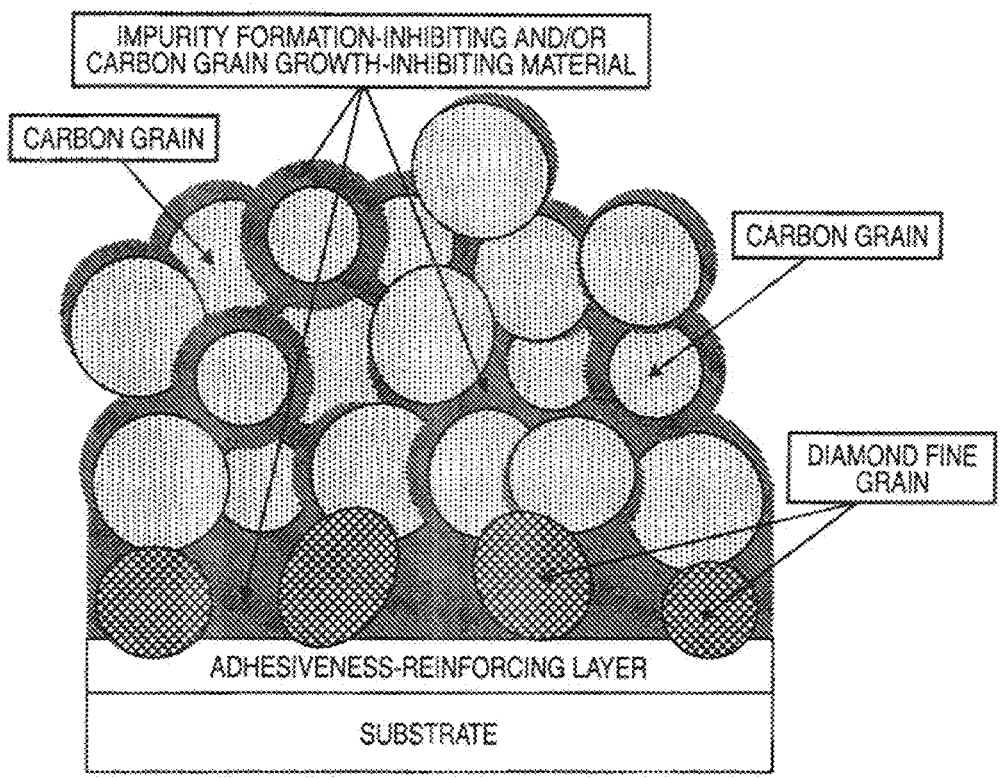
FIG. 3 It is a view showing a laminate structure of a laminate of the invention.
Figure 4:
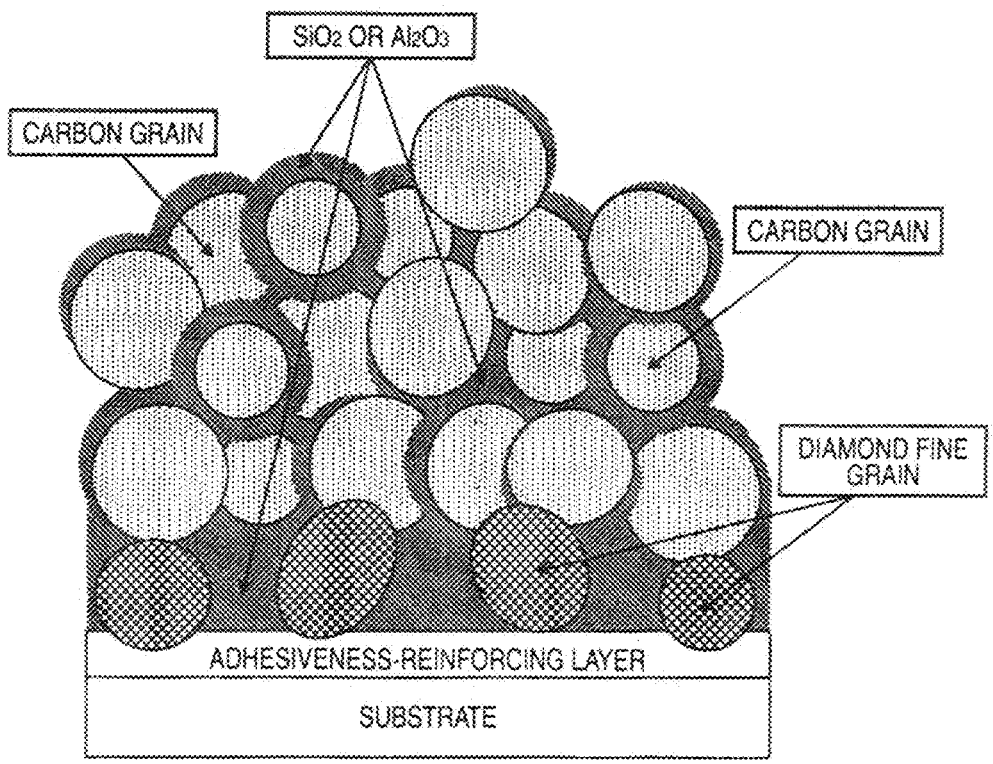
FIG. 4 It is a view showing a laminate structure of a laminate of the invention.

Another laminate of the invention comprises a substrate, an adhesiveness-reinforcing layer provided on the substrate and a carbon layer provided on the adhesiveness-reinforcing layer, wherein the carbon layer comprises a diamond fine grain provided on the adhesiveness-reinforcing layer and crushed by impact given thereto, a formation/growth inhibiting material that inhibits the formation of an impurity inhibiting the growth of a carbon grain and/or inhibits the growth of a carbon grain, and a carbon grain, and an amount (amount per unit volume) of the formation/growth inhibiting material decreases from a lower layer toward an upper layer on the adhesiveness-reinforcing layer side; and this has the laminate structure as in FIG. 3.

Concretely, the carbon layer comprises a diamond fine grain provided on the adhesiveness-reinforcing layer and crushed by impact given thereto, an $SiO_2$ material or $Al_2O_3$ material, and a carbon grain, and an amount (amount per unit volume) of the $SiO_2$ material or $Al_2O_3$ material decreases from a lower layer toward an upper layer on the side of the adhesiveness-reinforcing layer side. In the laminate, the carbon layer has 70 atomic % or more of the carbon grains in 80 nm or more from the lower layer of the carbon layer on the side of the adhesiveness-reinforcing layer, as in the laminate structure shown in FIG. 4.

In the invention, prior to the plasma CVD treatment for depositing the carbon layer on the substrate, diamond fine grains such as nanocrystalline diamond grains, cluster diamond grains or graphite cluster diamond grains are crushed by ultrasonic impact given thereto on the substrate or on the substrate with an adhesiveness-reinforcing layer formed thereon, whereby a part of the crushed diamond fine grains are made to cut into the surface of the substrate and a part thereof are adhered to the surface of the substrate. The diamond fine grains cutting into the substrate surface function as anchoring diamond fine grains which reinforce adhesiveness to the substrate of the carbon layer and/or as growing carbon grains contributing to the growth of the carbon layer. The diamond fine grains adhering to the substrate surface have a function as growth-contributing carbon grains that contribute to the growth of the carbon layer.

In general, nanocrystalline diamond grains are a diamond produced through explosion synthesis or by crushing diamond produced through high-temperature high-pressure synthesis.

Nanocrystalline diamond is already sold as, for example, a colloidal solution of nanocrystalline diamond by explosion synthesis dispersed in a solvent from NanoCarbon Research Institute Co., Ltd., or the like, or nanocrystalline diamond powder produced by crushing or its powder dispersed in a solvent from Tomei Diamond Co., Ltd., or the like. The nanocrystalline diamond grains for use in the invention have an average grain size of from 4 to 100 nm, preferably from 4 to 10 nm. Nanocrystalline diamond grains are described in detail in, for example, a reference such as Hiroshi Makita, New Diamond, Vol. 12, No. 3, pp. 8-13 (1996).

For providing nanocrystalline diamond grains on the substrate or the adhesiveness-reinforcing layer, first the grains are dispersed in water or ethanol. In this case, for improving the dispersibility, a surfactant (e.g., sodium laurylsulfate ester, sodium oleate) is added to prepare the dispersion.

The grain size distribution of the nanocrystalline diamond grains in the dispersion was determined according to a dynamic light scattering method. The apparatus used for the analysis is Dynamic Light Scattering Particle Size Analyzer LB-500 Model manufactured by Horiba Seisakusho Co., Ltd. The condition for the measurement and the parameters are as follows:

Distribution mode: monodispersion
Data input frequency: 100 times
Repetition frequency: 100 times
Grain size standard: volume
Sample refractive index: 1.600-0.000i
Dispersant refractive index: 1.333
Dispersant viscosity: 0.8270 mPa·s
Sample viscosity: 0.141 V
Test temperature: 28.5° C.

Figure 5:
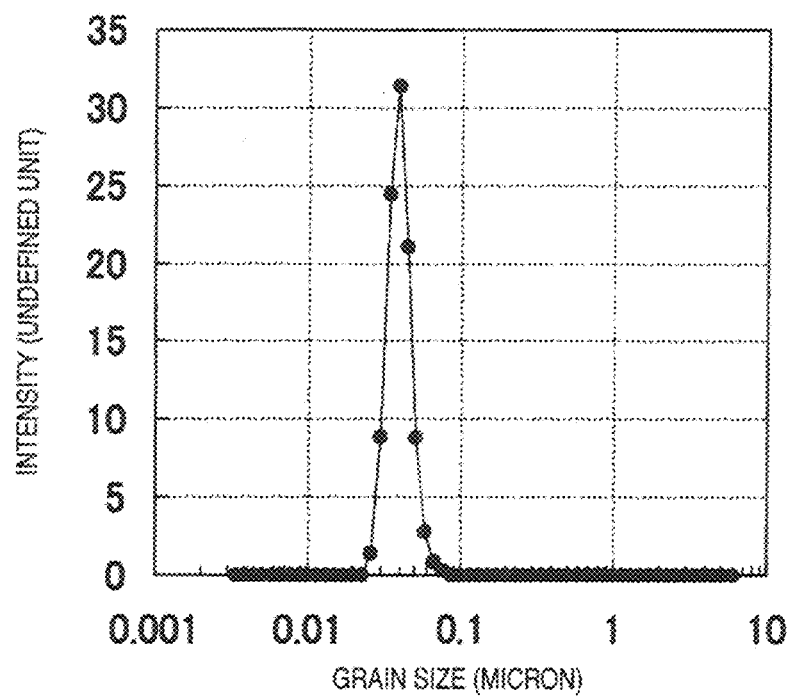
FIG. 5 It is a view showing a grain size distribution of the nanocrystalline diamond grains in a nanocrystalline diamond dispersion, as determined according to a dynamic light scattering method.

FIG. 5 shows the measurement data of the grain size distribution of nanocrystalline diamond grains in a nanocrystalline diamond grain dispersion, one example used in the invention. It has been found that the nanocrystalline diamond grains in the dispersion have the following grain size distribution.

Mathematical average size: 0.0370 μm
Mathematical standard deviation: 0.0070 μm

In the dispersion, the nanocrystalline diamond grains come to aggregate more in the dispersion with time after the preparation of the dispersion, and the mathematical average grain size thereof increases gradually. When the mathematical average grain size is more than 100 nm (0.1 μm), then the nanocrystalline diamond dispersion is unsuitable to ultrasonic treatment for production of the laminate of the invention. In general, the nanocrystalline diamond grains come to aggregate to a size of more than 100 nm in about 6 months after the preparation of the dispersion. Accordingly, in about 6 months taken as a prospect, an additional fresh nanocrystalline diamond dispersion is prepared and used in place of the previous one, suitably to production of the laminate of the invention.

In the invention, a substrate is dipped in the dispersion of nanocrystalline diamond grains and then processed with an ultrasonic washer. By the physical impact force of the ultrasonic waves, concretely by the ultrasonic output power of 600 W at a frequency of 40 kHz of the ultrasonic washer having a capacity of 26 liters, the nanocrystalline diamond grains are crushed through collision of the nanocrystalline diamond grains with each other or through collision thereof with the substrate or with the adhesiveness-reinforcing layer, and further, they are accelerated toward the surface of the substrate or the surface of the adhesiveness-reinforcing layer by the impact force of the ultrasonic waves and collide with it. Those having given a sufficient impact force cut into the surface of the substrate or the surface of the adhesiveness-reinforcing layer. The nanocrystalline diamond grains thus cutting into the surface function as an anchor so that the carbon layer holds a high adhesiveness to the surface of the substrate or the surface of the adhesiveness-reinforcing layer. On the other hand, the nanocrystalline diamond grains not given a sufficient impact force adhere to the surface of the substrate or the surface of the adhesiveness-reinforcing layer. These have the function of contributing to the growth of the carbon layer through CVD treatment.

For effectively taking the impact force of ultrasonic waves, an ultrasonic washer must be used having an ultrasonic output power of 4 W or more per liter of the capacity of the washer. An ultrasonic washer of which the power is less than it may have a small impact force and could hardly produce a sufficient grains-holding force onto the surface of the substrate or the surface of the adhesiveness-reinforcing layer.

After the substrate or the substrate with an adhesiveness-reinforcing layer formed thereon is ultrasonically processed in the above-mentioned nanocrystalline diamond dispersion, the substrate or the substrate with an adhesiveness-reinforcing layer formed is dipped in ethanol for ultrasonic washing therein, and then taken out and dried.

Figure 6:
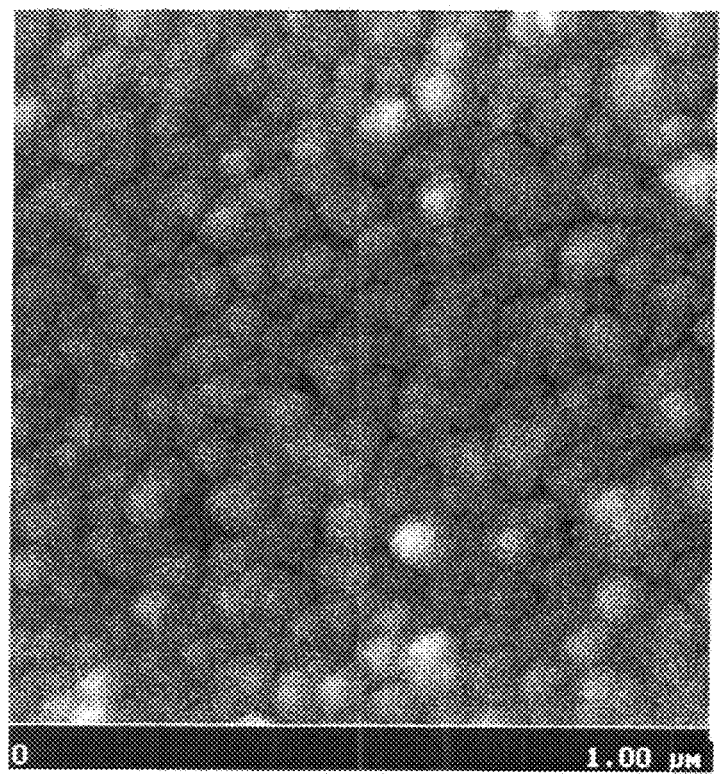
FIG. 6 It is a surface of a borosilicate glass substrate ultrasonically processed with a nanocrystalline diamond dispersion, as observed with an atomic force microscope.

FIG. 6 is a photograph, as observed through an atomic force microscope, of the surface of a borosilicate glass substrate which was ultrasonically processed in the above-mentioned nanocrystalline diamond dispersion, then dipped in ethanol for ultrasonic washing therein, and thereafter taken out and dried. It can be seen that the surface of the borosilicate glass substrate is coated with grains having a grain size of from 10 nm to 50 nm.

It can be seen that, in that manner, high-density nanocrystalline diamond grains adhere to or cut into the surface of the glass substrate through the ultrasonic treatment with the above-mentioned nanocrystalline diamond dispersion. In the drawing, the density of the nanocrystalline diamond grains cutting into or adhering to the surface of the glass substrate was $5 \times 10^{10}$ grains/cm$^2$. In order to attain the adhesion strength between the carbon layer and the glass substrate to such a degree that the laminate of the glass substrate and the carbon layer is utilizable as a polishing material or a grinding material to be mentioned hereinunder, the density of the nanocrystalline diamond grains cutting into or adhering to the surface of the glass substrate is preferably from $10^9$ to $10^{12}$ grains/cm$^2$, more preferably from $10^{10}$ to $10^{11}$ grains/cm$^2$.

In the invention, after nanocrystalline diamond grains are provided on the substrate or the adhesiveness-reinforcing layer, they are processed with a microwave plasma CVD apparatus.

In the invention, inside a microwave plasma CVD reactor, placed are a supply source of an $SiO_2$ material or $Al_2O_3$ material and the substrate prepared in the previous step, and during CVD treatment therein, the substrate is kept at room temperature to 500° C.

A mixed gas of a carbon-containing gas, an argon gas and/or a hydrogen gas is introduced as the reaction gas into the microwave plasma CVD reactor, in which a plasma is generated under a gas pressure of from 1 to 100 pascals, and the substrate is placed at a position at which an electron temperature of the plasma is from 0.5 to 3.0 eV, and the radical particles in the plasma are moved toward the substrate from the plasma generation source such that the radical particles almost uniformly reach on the surface of the substrate. The invention employs the carbon layer deposition method comprising these steps to attain an object thereof.

An outline of the production method for the laminate of the invention is described below with reference to examples.

For example, an adhesiveness-reinforcing layer is optionally provided on a material of glass, silicon, iron, iron-base alloy, stainless, aluminium, copper, plastic or the like, or the material is further pre-treated ultrasonically with diamond fine grains, then this is set in a low-temperature microwave plasma CVD apparatus, in which the radical particles in a plasma to be the film-forming source are moved from the plasma generation source toward the substrate set on the sample holder in a mode of down flow supply for plasma CVD treatment so as to reach the radical particles almost uniformly on the surface of the substrate.

The surface of the substrate of glass, silicon or the like may be directly processed for ultrasonic treatment with a dispersion of nanocrystalline diamond grains to thereby form nanocrystalline diamond grains cutting into or adhering to the surface of the substrate. Next, the substrate is processed with a microwave plasma CVD apparatus to thereby attain the adhesion strength between the carbon layer and the substrate necessary for polishing or grinding.

Also the surface of the substrate of iron, iron-base alloy, stainless, aluminium, copper, plastic or the like material may be directly processed for ultrasonic treatment with a nanocrystalline diamond dispersion to thereby form nanocrystalline diamond grains cutting into or adhering to the surface of the substrate. Next, the substrate is processed with a microwave plasma CVD apparatus to thereby form a carbon layer.

However, the material of iron, iron-base alloy, stainless, aluminium, copper, plastic or the like could hardly attain a high adhesion strength between the carbon layer and the substrate necessary for polishing or grinding. For this type of the substrate, an adhesiveness-reinforcing layer may be provided on the surface of the substrate, and the surface of the adhesiveness-reinforcing layer may be ultrasonically treated with a nanocrystalline diamond dispersion to thereby form nanocrystalline diamond grains cutting into or adhering to the surface of the adhesiveness-reinforcing layer. The method is extremely effective for attaining the adhesion strength of the carbon layer to this type of the substrate. As the adhesiveness-reinforcing layer for the carbon layer to the substrate, for example, effective is titanium (Ti), titanium nitride (TiN), silicon carbide (SiC), silicon nitride ($Si_3N_4$) or the like. The adhesiveness-reinforcing layer may be provided on the surface of the substrate according to a sputtering method or a vacuum deposition method. The thickness of the adhesiveness-reinforcing layer is suitably about 1 µm.

The plasma CVD treatment time is from a few minutes to several tens of hours; and the treatment temperature is from 20 to 500° C.

In the invention, the gas pressure in plasma CVD treatment and the position at which the substrate is placed are extremely important, and are confirmed as follows.

Figure 7:
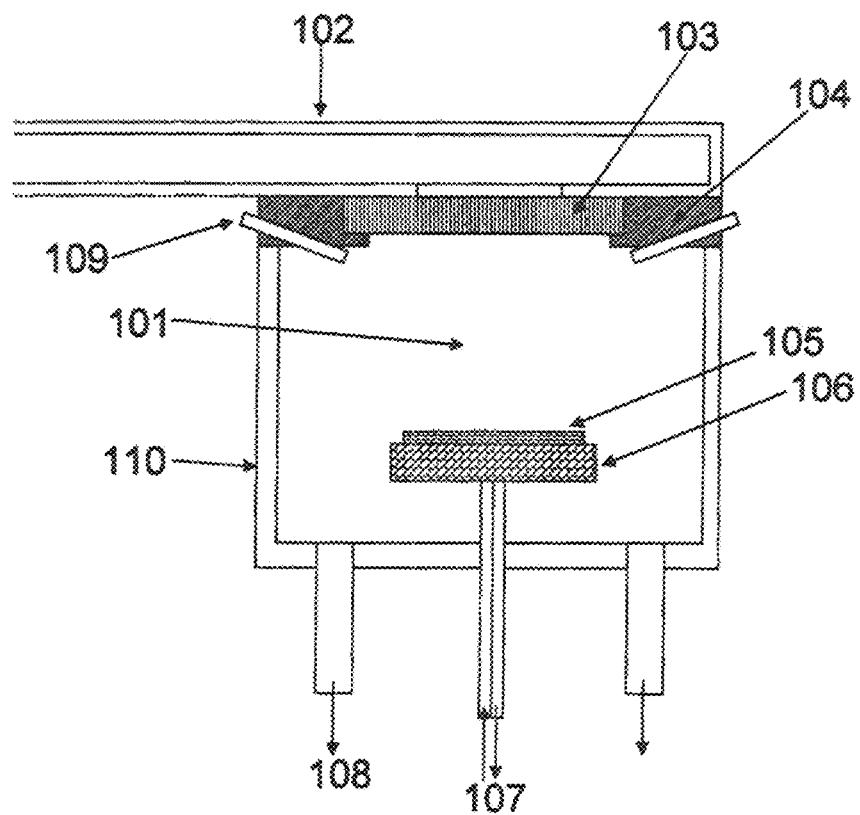
FIG. 7 It is a view showing the constitution of an apparatus for producing a laminate of the invention.

FIG. 7 shows one example of an apparatus for use in producing the laminate of the invention.

In the drawing, 101 is a microwave plasma CVD reactor (hereinafter simply referred to as "plasma generation chamber"), 102 is a slotted square waveguide tube for introducing microwaves into the plasma generation chamber 101, 103 is a quartz member for introducing microwaves into the plasma generation chamber 101, 104 is a metal-made supporting frame for supporting the quartz window, 105 is a substrate for film formation thereon, 106 is a sample holder for placing the substrate for film formation thereon, and is equipped with a vertically-moving mechanism and a cooling system for the substrate for film formation thereon, and 107 is a supply and drain water for cooling water. 108 is evacuation, and 109 is a gas introduction pipe for plasma generation. 110 is a reactor for plasma CVD treatment.

The apparatus is driven for plasma generation, as follows.

The plasma generation chamber 101 is degassed into vacuum through a degassing system (not shown). Next, a plasma generation gas is introduced into the plasma generation chamber 101 at a given flow rate via the gas introduction pipe 109 to the plasma generation chamber. Next, a pressure control valve (not shown) provided in the degassing system is controlled to hold the inside of the plasma generation chamber 101 at a given pressure. Microwaves of a desired electric power are supplied in the plasma generation chamber 101 from a 2.45-GHz microwave generation unit (not shown) through the slotted square waveguide tube 102 and the quartz member 103, whereby a plasma is generated in the plasma generation chamber 101. Accordingly, the radical particles in the plasma to be the film formation source can be supplied in a down flow manner by moving the radical particles toward the resin substrate placed on the sample holder from the lower surface (on the CVD treatment reactor side) of the quart member 103 for microwave introduction which is to be the plasma generation source so that the radical particles almost uniformly reaches on the surface of substrate.

Figure 8:
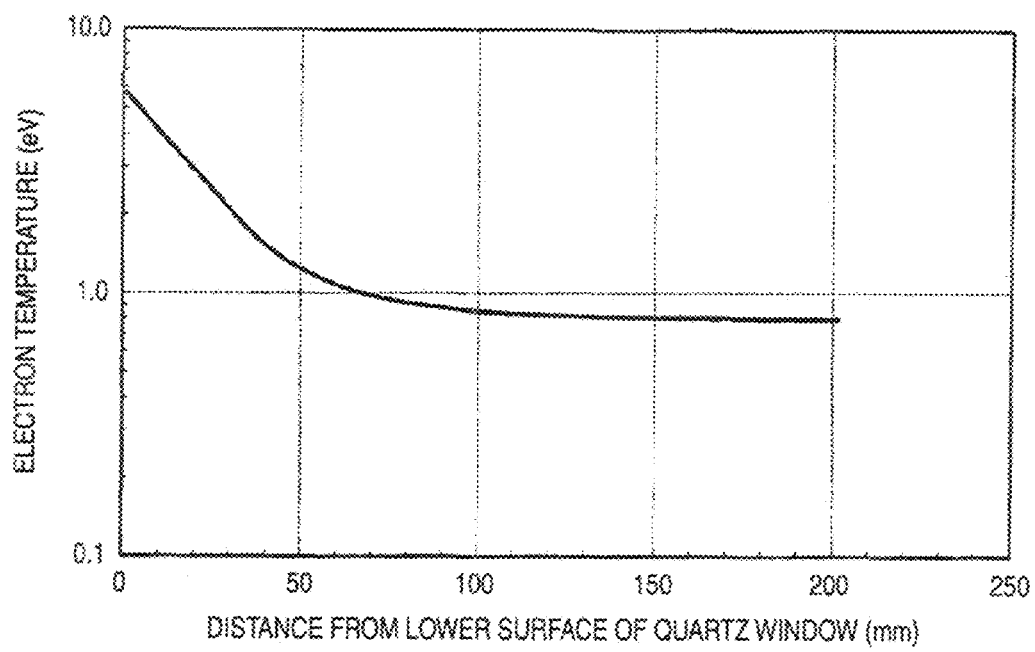
FIG. 8 It is a view showing the dependence of the electron temperature (kinetic energy of electron) in plasma on the distance from the lower surface (on the CVD reactor side) of the quartz window for microwave introduction, as obtained through plasma characteristic determination using a Langmuir probe.

FIG. 8 shows the dependence of the electron temperature (kinetic energy of electron) in plasma on the distance from the lower surface (on the CVD reactor side) of the quartz window for microwave introduction, as obtained through plasma characteristic determination using a Langmuir probe. The Langmuir probe used for the plasma characteristic determination was a plasma diagnostic probe L2P Model manufactured by Kobe Steel, Ltd. In this case, to precisely determine the plasma density and the electron temperature of the microwave-excited electroless discharge plasma, two probes of platinum and tungsten were used according to a double-probe method. The Langmuir probe method is described in detail, for example, in a reference, Hideo Sugai, Plasma Electronics, Ohm-sha, 2000, p. 58.

Figure 9:
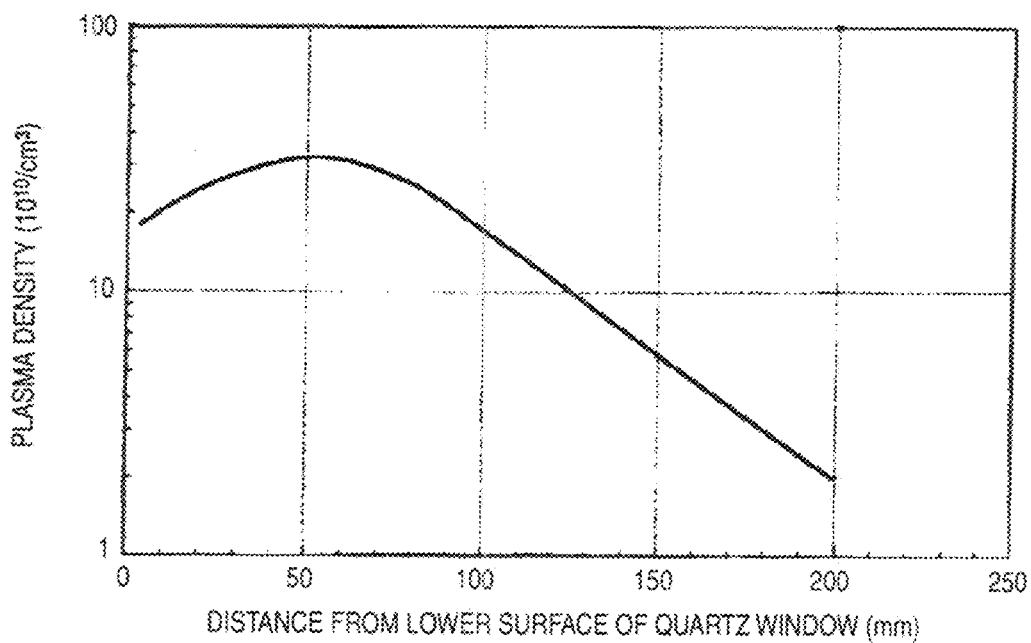
FIG. 9 It is a view showing the dependence of the plasma density on the distance from the lower surface (on the CVD reactor side) of the quartz window for microwave introduction.

The gas used for determination to give the graph is 100% hydrogen, and the pressure is 10 Pa. Thus, the electron temperature in the plasma has the characteristic that it decreases with the increase in the distance from the quartz window. FIG. 9 shows the dependence of the plasma density on the distance from the lower surface (on the CVD reactor side) of the quartz window for microwave introduction.

Other than the above-mentioned measurement, the electron temperature and the plasma density were further determined by mixing from 0.5 to 10 mol % of methane gas, from 0 to 10 mol % of carbon dioxide, from 0 to 95.5 mol % of hydrogen gas, and from 0 to 95.5 mol % of argon gas in any desired ratio. As a result, the plasma characteristics did not almost change within the tested gas mixture range.

A substrate was placed on a vertically-movable sample holder, so that the substrate could be arranged at any desired position spaced from the quartz window. Based on the data of the electron temperature in plasma shown in FIG. 8 and the plasma density shown in FIG. 9, hydrogen and other gases necessary for CVD treatment were charged into the plasma generation chamber, and film formation tests were conducted by variously changing the position of the resin substrate under a gas pressure of 10 Pa, and the optimum electron temperature and plasma density conditions for film formation were searched out. The gases necessary for CVD treatment will be described hereinunder.

As a result, it has been found that a film was not formed at a position of the substrate at which the electron temperature was 3 eV or higher, or not a carbon film of the invention but a soot-like film was merely deposited slightly. For example, under a pressure of 10 Pa in FIG. 8, no film was formed or a soot-like film was merely deposited slightly at the region spaced by 20 mm or less from the quartz window.

On the other hand, in the region having an electron temperature of 3 eV or less, a carbon layer according to the invention was confirmed. For example, under a pressure of 10 Pa, it was confirmed that the film was formed within a region of from 20 mm to 200 mm. Under a pressure of 10 Pa, the electron temperature within the range was from 3 eV to 0.8 eV.

The vertically-movable range of the sample holder used in this experiment was at most 200 mm, and therefore, no experiment could be carried out at a distance larger than the range. However, by devising the sample holder, experiments at a further larger distance are possible.

Within the region where the film formation was confirmed, the film-formation rate was the largest at a distance spaced from the quartz window by from 50 to 70 mm. This is supported by the plasma density dependence on the distance from the quartz window in FIG. 9, in which the plasma density was the largest at 50 mm, and therefore it may be said that the film-formation rate may be the largest at about 50 mm. Accordingly, it has been clarified that, in order to make the film-formation rate as large as possible, the position of the substrate optimum for film formation thereon is the position at which the electron temperature is 3 eV or less and the plasma density is the largest.

The above experiments were conducted under various gas pressures. As a result, it has been found the gas pressure suitable for deposition of the carbon layer is from 1 to 100 Pa, preferably from 1 to 50 Pa. When the gas pressure was 200 Pa or more, the film formation could not be confirmed. This is considered because the gas pressure is high, and therefore the thermal damage, the thermal expansion and the thermal deformation of the substrate owing to the heating by plasma are large. It has been further clarified from those experiments that the optimum position of the substrate for film formation thereon varies depending on the gas pressure in plasma CVD treatment. It has been clarified that when the substrate is placed at a position at which the plasma electron temperature is from 0.5 to 3 eV, then a carbon layer can be deposited on the substrate.

The reason why the position of the substrate suitable for film formation thereon can be selected may be because the radical particles in plasma to be the film formation source are moved toward the substrate placed on the sample holder from the plasma generation source in such a manner that the radical particles can almost uniformly reach on the surface of the substrate, whereby the electron temperature distribution that gradually decreases from the plasma generation source toward the substrate can be formed, as in FIG. 8.

In the invention, the starting gas (reaction gas) used in CVD treatment is a mixed gas of a carbon-containing gas, an argon gas and/or hydrogen. The carbon-containing gas includes methane, ethanol, acetone, methanol, etc.

The mixing ratio of the mixed gas suitable for film formation varies, depending on the substrate to be used, and also varies depending on the surface condition of the substrate; but the concentration of the carbon-containing gas is from 0.5 to 10 mol %, preferably from 1 to 4 mol %. When the carbon-containing gas is larger than the range, then it is unfavorable as causing a problem in that the adhesion strength to the substrate may lower.

Preferably, $CO_2$ or CO may be added as an additional gas to the mixed gas. These gas may serve as an oxygen source, and in plasma CVD treatment, it acts to remove impurities. The amount of $CO_2$ and/or CO to be added is preferably from 0.5 to 10 mol %, more preferably from 1 to 5 mol % based on the total mixed gas.

Addition of argon gas and/or hydrogen is extremely effective for prevention of surface damage by plasma in case where the substrate is a plastic material. In particular, in case where a plasma-resistant film is not provided on the surface of a resin, it is effective to increase the proportion of argon gas as compared with the proportion of hydrogen for prevention of damage by plasma. The proportion of the hydrogen gas is suitably from 0 to 95.5 mol %, and the proportion of the argon gas is suitably from 0 to 95.5 mol %.

In the CVD treatment, a substance that inhibits the formation of impurities such as amorphous carbon and graphite to be formed along with the formation of the carbon grains to constitute the carbon layer, and/or inhibits the growth of the carbon grains must be fed into the CVD treatment chamber, along with the starting gas for the carbon grains such as carbon-containing gas, and argon gas and/or hydrogen gas and optionally $CO_2$ and/or CO to be fed thereinto. In the invention, the most suitable substance that inhibits the formation of impurities such as amorphous carbon and graphite to be formed along with the formation of the carbon grains to constitute the carbon layer, and/or inhibits the growth of the carbon grains is an $SiO_2$ material or an $Al_2O_3$ material.

In the plasma CVD method for producing the laminate of the invention, quartz was used as the material for the member 103 for introducing microwaves into the plasma generation chamber 101. The quartz plays an important role as a supply source for $SiO_2$ material which is to be the amorphous substance, which inhibits the formation of impurities such as amorphous carbon and graphite to be formed along with the formation of the carbon grains to constitute the carbon layer, and/or inhibits the growth of the carbon grains.

Specifically, when the quartz tube is exposed to the starting gas converted into plasma by microwaves, then an Si gas and an oxygen gas are produced to give plasma along with the starting gas. These plasmas have a higher density, when nearer to the quartz tube, and their expansion through diffusion is substantially toward the substrate. Along with the diffusion thereof, they can be more efficiently supplied to the substrate by the down flow thereof with the starting gas. The control of the supply amount may be attained by controlling the gas pressure inside the CVD chamber for plasma density control therein and by controlling the formation rate of the Si gas and the oxygen gas. It has been clarified through gas concentration analysis that, when the Si gas concentration is so controlled as to be on the same level as that of the methane gas concentration, then the formation of impurities such as amorphous carbon and graphite to be formed along with the formation of carbon grains and/or the formation of the growth of carbon grains can be inhibited more effectively. For example, a mixed gas in which the concentration of methane gas, $CO_2$ and Si gas is so controlled as to be the same within a range of from 1 to 5 mol % and the remainder is hydrogen gas was significantly suitable for production of the laminate of the invention.

As the material for the member 103 for introducing microwaves into the plasma generation chamber 101, alumina ($Al_2O_3$) can be used. In this case, alumina functions as the substance that inhibits the growth of impurities such as amorphous carbon and graphite to form along with the formation of carbon grains and/or inhibits the growth of carbon grains.

It is desirable that the amorphous substance is formed at a low atmospheric temperature in the reactor, preferably under a temperature condition of from room temperature to 600° C., more preferably from room temperature to 450° C. so as to precipitate and fill in the grain boundary of carbon grains and/or in the space between carbon grains at a high density, as will be described below. At a temperature falling outside the temperature range, the amorphous substance Si and/or $SiO_2$ could not be formed. The formation of the amorphous substance and the function of Si and/or $SiO_2$ are as follows. Si tends to dissolve in carbon grains along with the formation of the carbon particles, but they precipitate on the surface of the carbon grains due to a low temperature. Si having precipitated on the surface then precipitates on the grain surface directly as amorphous Si, that is, precipitates in the grain boundary of carbon atoms and/or in the space between carbon grains, or is oxidized with oxygen in plasma to precipitate and fill therein as amorphous $SiO_2$. Heretofore, formation of Si and/or $SiO_2$ which is to be the amorphous substance, was confirmed in CVD treatment at a low temperature up to room temperature.

Observation with an optical microscope of the surface of the carbon layer thus deposited on the substrate in the manner as above has clarified that a carbon layer having a thickness of 50 nm or less is difficult to be uniformly formed on a substrate. It has been clarified that a carbon layer having a thickness of 50 nm or more can be uniformly formed on a substrate, and that a carbon layer having a thickness of 100 nm or more can be formed more uniformly on a substrate. On the other hand, a carbon layer having a thickness of 10 μm or more often peels away from the substrate on which it has been deposited. A carbon layer having a thickness of 5 μm or less had a satisfactory adhesiveness, as confirmed in an adhesion strength test with a Scotch tape. Accordingly, the thickness of the carbon layer in a laminate comprising a substrate and the carbon layer formed thereon is suitably from 50 nm to 10 μm, preferably from 100 nm to 5 μm.

Figure 15:
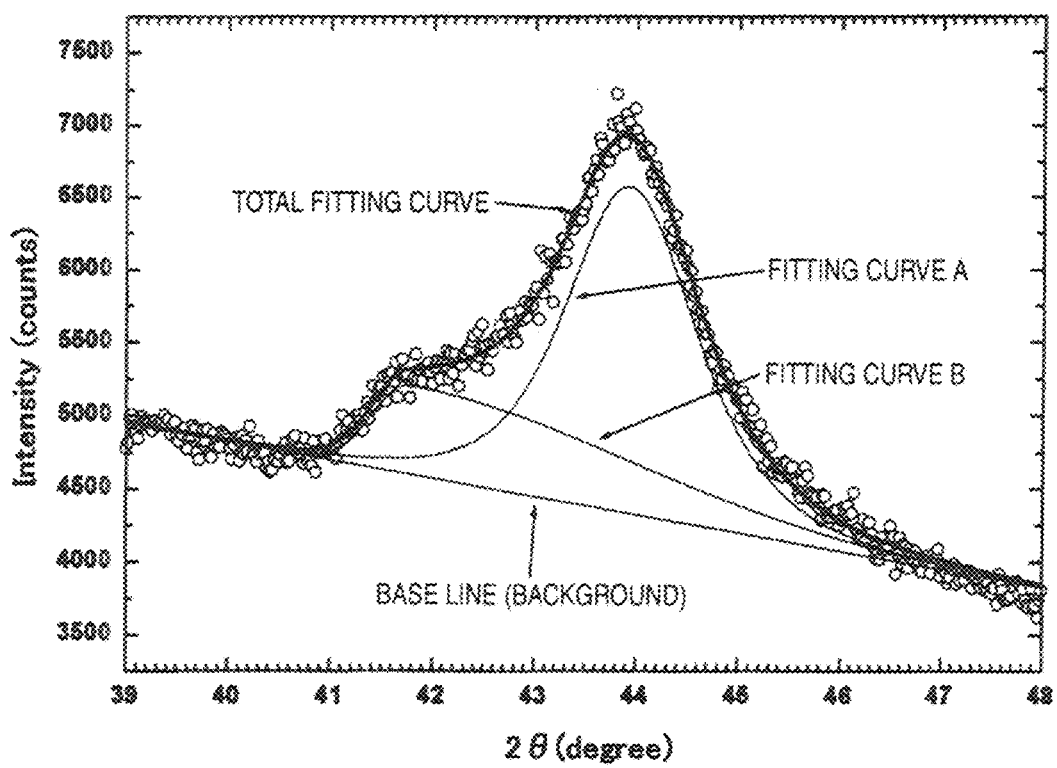
FIG. 15 It is a view showing an example of an X-ray diffraction spectrum with CuK$_{\alpha 1}$ X-ray of a carbon film of a laminate of the invention, and a peak fitting result.

According to the invention, a laminate comprising a carbon layer and a substrate can be produced. The carbon layer has significant characteristics different from those of other carbon grains and carbon layer of diamond or the like, in that the carbon layer has an approximate spectrum curve obtained by superimposing a peak fitting curve B having a Bragg's angle ($2\theta \pm 0.3°$) of $41.7 \pm 0.3°$ and a base line on a peak fitting curve A having $43.9°$ in the X-ray diffraction spectrum with $CuK_{\alpha 1}$ ray, as seen in FIG. 15 to be mentioned below.

In addition, the carbon layer of the laminate has excellent planarity and adhesiveness, and its surface roughness Ra is 20 nm or less, or as the case may be, 3 nm or less and the surface is thus planar.

Observation with a high-resolution transmitting electronic microscope of the cross section of the layer of the laminate of the invention has confirmed the characteristic of the carbon layer in that the layer is formed to be densely filled with crystalline carbon grains having a grain size of from 1 nm to several tens of nm with no space and, in addition, the grain size distribution does not change in the boundary between the carbon layer and the substrate, inside the carbon layer and in the vicinity of the outermost surface layer of the carbon layer (the average grain size is almost the same). The thickness of the carbon layer formed is preferably from 2 nm to 100 μm, more preferably from 50 to 500 nm, and the grain size of the grains is preferably from 1 to 100 nm, more preferably from 2 to 20 nm.

The cross section of the laminate of the invention was observed with a high-resolution transmitting electronic microscope (HRTEM). The observation was conducted with H-9000 Model transmitting electronic microscope manufactured by Hitachi, Ltd. as the HRTEM apparatus, and the acceleration voltage of 300 kV. A standard inclined sample holder of the HR-TEM apparatus was used as the sample holder. The sample for observation was prepared according to a method of (1) slicing through Ar-ion milling treatment, (2) slicing through focused ion beam (FIB) processing, or (3) peeling the surface of the carbon layer with a diamond pen and collecting the peel on a microgrid.

Figure 10:
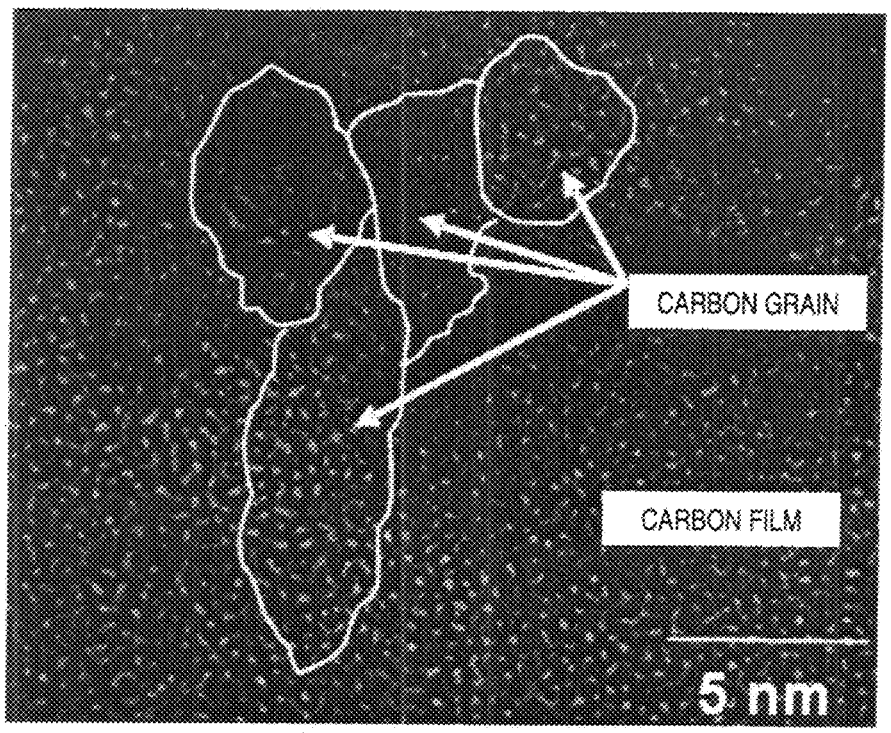
FIG. 10 It is a cross section of the carbon layer of a laminate of the invention, as observed with a high-resolution transmitting electron microscope (HRTEM).
Figure 11:
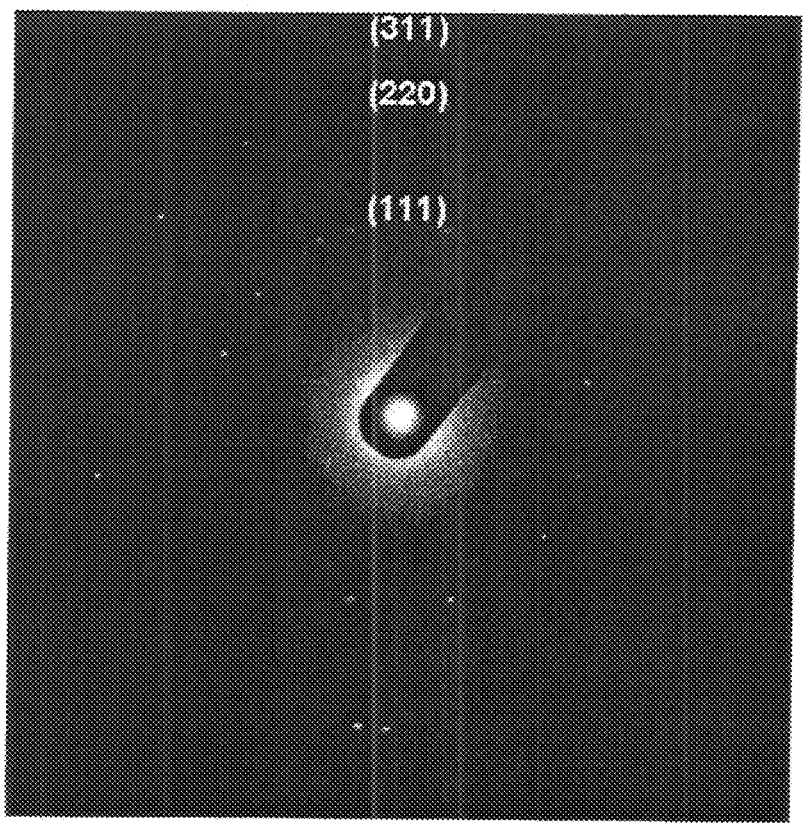
FIG. 11 It is an electron beam diffraction image of the carbon layer of a laminate of the invention.
Figure 12:
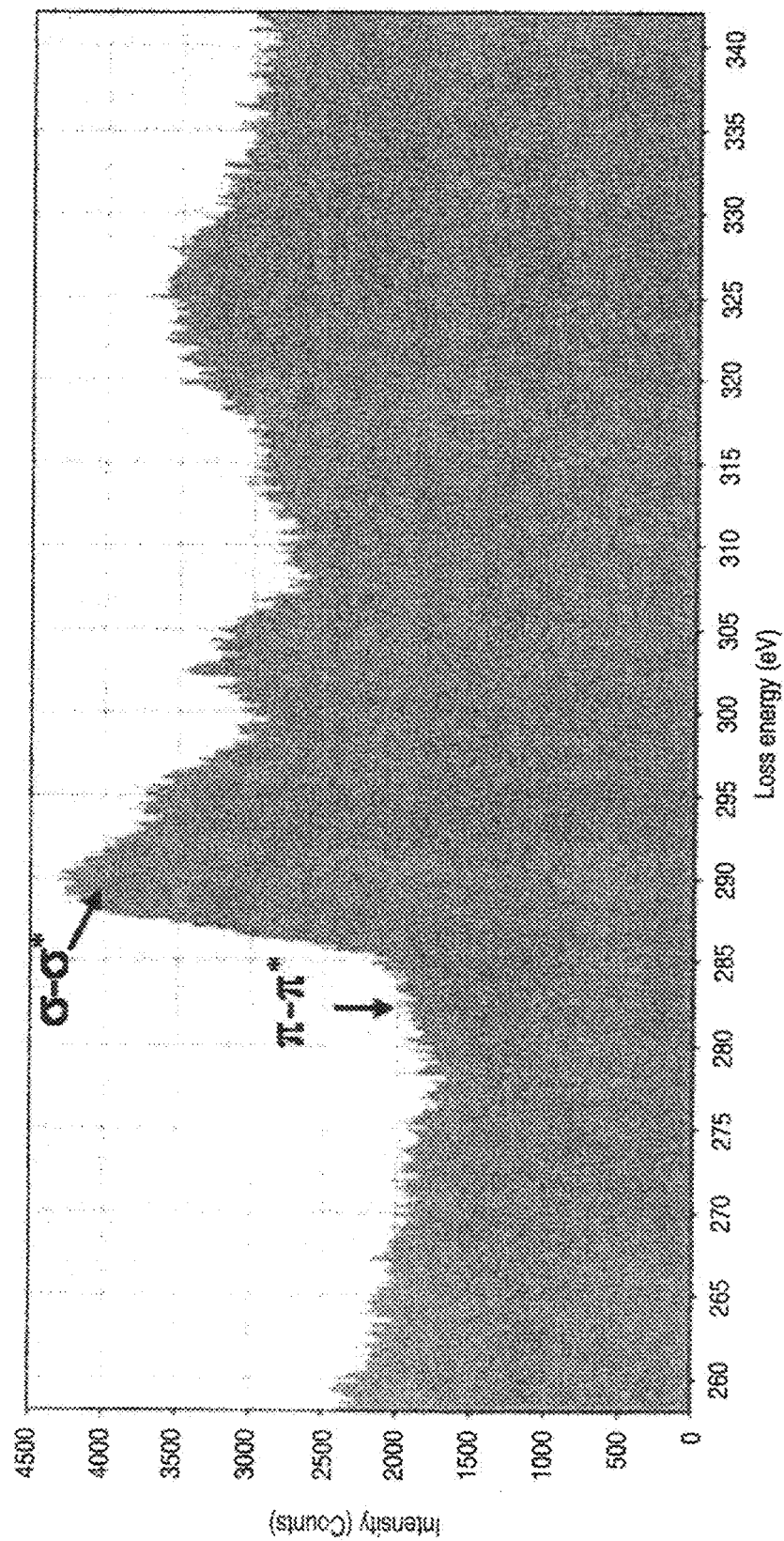
FIG. 12 It is a spectral (C—K shell absorption end) view of electron energy loss spectrometry (EELS).

The observation results are shown in FIG. 10 to FIG. 12. FIG. 10 to FIG. 12 are observation examples of the cross section of a carbon layer on a glass substrate. In this case, the samples were prepared through ion milling treatment. FIG. 10 shows an electromicroscopic image of the cross section of the carbon layer; FIG. 11 shows an electron beam diffraction image of the carbon layer; and FIG. 12 shows the test result of electron energy loss spectrometry (EELS) at the carbon-K shell absorption end of the carbon grains constituting the carbon layer.

From FIG. 10, it can be seen that the cross section of the carbon layer is fully filled up in the entire surface thereof with no space.

The electron beam diffraction image of FIG. 11 is similar to the ring pattern of random-oriented polycrystalline diamond. However, especially in the ring corresponding to the diamond (111) face, there are a large number of diffraction spots not on one ring, and these correspond to diffraction on the face broader by from 2 to 6% than the diamond (111) face in terms of spacing. In this point, the carbon layer significantly differs from ordinary diamond. Further, crystalline grains having a grain size of about 5 nm exist in the carbon layer. In addition, it was observed that one grain comprises one or more crystallites.

From the EELS spectrum of FIG. 12, it can be seen that there exist few peaks corresponding to $\pi$-$\pi^*$ transition that indicates the existence of a C—C $sp^2$ bond and the peaks corresponding to $\sigma$-$\sigma^*$ transition that indicates the existence of a $sp^3$ bond component are dominant. In other words, it can be seen that the carbon layer comprises crystalline carbon grains of $sp^3$-bonding carbon atoms.

The crystallite as referred to herein means a microcrystal that may be considered as a single crystal, and in general, one grain comprises one or more crystallites. As a result of the HRTEM observation, the size (average grain size) of the carbon grains (crystallites) of the carbon layer does not change in the interface to the substrate, inside the layer and in the outermost surface of the layer, falling within a range of from 2 to 40 nm.

In case where the carbon layer is considered to be densely filled with grains with no space therebetween, the average grain size may be determined according to the following process.

Specifically, the average grain size was determined as an average of the grain sizes of 100 or more different grains (crystallites) on a transmitting electromicroscopic image of the cross section of a carbon layer. In FIG. 10, the area surrounded by the white closed curve is one grain, and the area surrounded by the closed curve is measured, and the value is S. The grain size D was defined as follows:

$$D = 2\sqrt{\frac{S}{\pi}}$$

wherein $\pi$ means the ratio of the circumference of a circle to its diameter.

The surface density $d_s$ of the grains was determined from the average grain size of the grains, as follows:

$$d_s = \text{unit area}/(\pi \times (\text{average grain size}/2)^2)$$

When the surface density of the carbon layer of the laminate of the invention was determined in the manner as above, then it was known that the surface density did not change in the interface, inside the layer and in the outermost surface, falling within a range of from $8 \times 10^{10}/cm^2$ to $4 \times 10^{12}/cm^2$.

The cross section of the laminate of the invention was analyzed in point of the layer structure and the element distribution thereof, as follows. Slices of the laminate were prepared by ion-milling, and analyzed with a high-resolution transmitting electronic microscope and through electron energy loss spectrometry (EELS).

At different sites thereof, the sample was analyzed through EELS spectrometry in a region of about $\phi 100$ nm, in which Si was detected in every observation site. In addition, it was known that the amount of Si varies in different observation sites.

Figure 13:
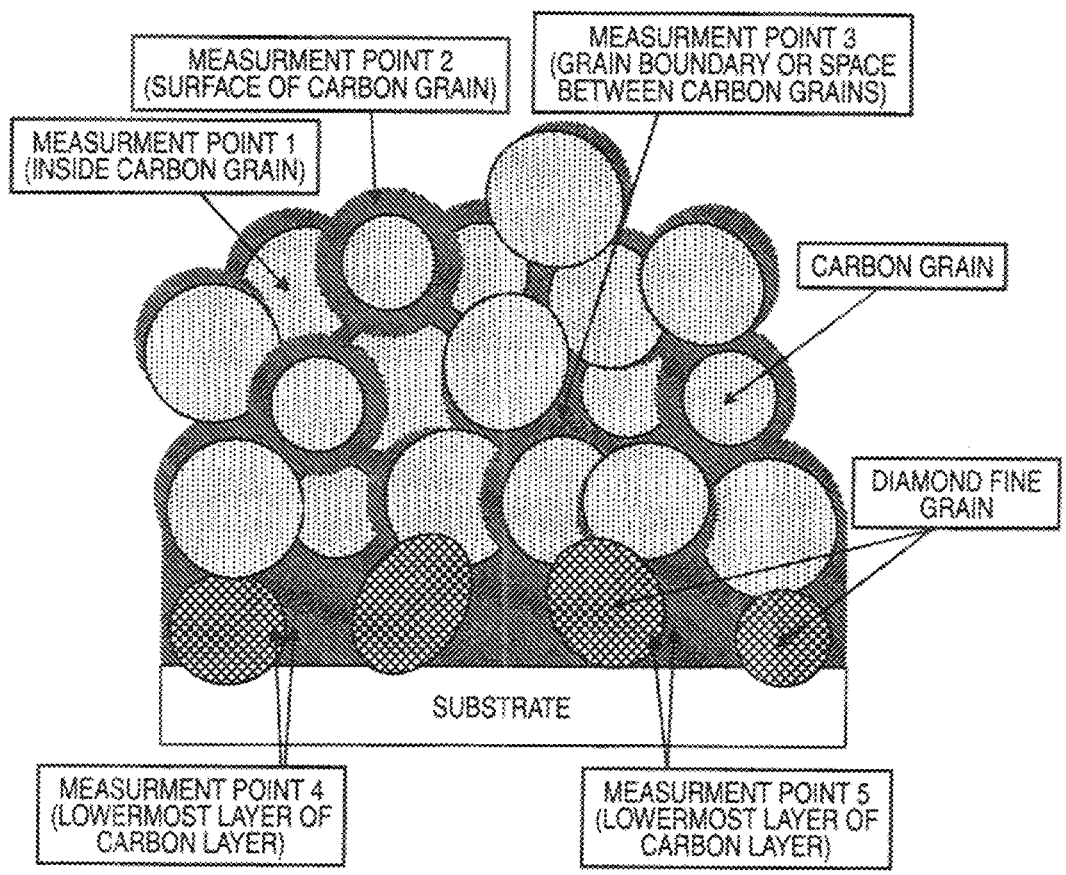
FIG. 13 It is a graphic view of a laminate comprising a silicon substrate and a carbon layer of the invention in observation with a high-resolution transmitting electron microscope of the cross section of the carbon layer just above the silicon substrate.

For elementary distribution analysis in a more smaller region, it was further analyzed through precision EELS, in which the spectrum was analyzed in detail. In the EELS spectrum, the signals for the peak of Si (silicon) at around 120 eV, the peak of C (carbon) at around 300 V and the peak of O (oxygen) at around 530 eV were remarkable, and these were specifically noted. FIG. 13 graphically shows the high-resolution transmitting electromicroscopic image of the sample analyzed herein. The measurement point 1 is in one carbon grain; the measurement point 2 is the surface part of a carbon grain, and the measurement k point 3 is a part not a carbon grain, slightly seen in the layer.

From the peak profile in the EELS spectrum, the measurement point 1 is Si and C, not $SiO_2$; the measurement point 2 is $SiO_2$ and C; and the measurement point 3 is $SiO_2$ and C. Accordingly, in the carbon layer of the laminate of the invention, $SiO_2$ exists in the surface of the carbon grains constituting the carbon layer, preferably surrounding the carbon grains. In the diffraction image of FIG. 11, there was detected no diffraction ring indicating the existence of crystalline $SiO_2$. Accordingly, it was known that $SiO_2$ exists in the carbon layer as an amorphous one. In the carbon layer of the laminate of the invention, amorphous $SiO_2$ exists in the surface of the carbon grains constituting the layer, preferably surrounding the carbon grains. The characteristic constitution of the carbon layer has been realized only in the carbon layer of the laminate produced according to the method of the invention, and could not be seen in any conventional diamond or diamond-like carbon film.

The amorphous $SiO_2$ plays an extremely important role as a substance that inhibits the formation of impurities such as amorphous carbon and graphite to form along with the formation of the carbon grains in the grain boundary of the carbon grains and/or in the space between the carbon grains, and/or inhibits the growth of the carbon grains.

In the region of about from 10 to 20 nm of the lowermost layer (just above the substrate) of the carbon layer in the laminate of the invention, spot-like presence of a crystalline substance in the amorphous substance was confirmed. From the peak profile in the EELS spectrum, it was known that the substance to form the region of about from 10 to 20 nm of the lowermost layer (measurement point 4, measurement point 5) of the carbon layer in FIG. 13 is $SiO_2$ and C. Analysis of the diffraction image confirmed that $SiO_2$ is amorphous, and C is crystalline diamond. Accordingly, it has become clarified that, in the region of about from 10 to 20 nm of the lowermost layer of the carbon layer, nanocrystalline diamond grains are provided through ultrasonic treatment of the substrate surface, and the nanocrystalline diamond grains cut into or adhere to the substrate surface through CVD treatment, and amorphous $SiO_2$ is formed so as to fill the space between the grains. The amorphous $SiO_2$ existing in the lowermost layer of the carbon layer plays an extremely important role as a substance that inhibits the formation of impurities such as amorphous carbon and graphite which form along with the formation of the carbon grains in the grain boundary of the nanocrystalline diamond grains, in the grain boundary of the carbon grains and/or in the space between the carbon grains, and/or inhibits the growth of the carbon grains.

The above-mentioned amorphous $SiO_2$ existed much in the region of about from 10 to 20 nm of the lowermost layer of the carbon layer, and was about 50 atomic % or more. It has been found that the amount of the amorphous $SiO_2$ decreases toward the upper layer from the lower layer of the carbon layer on the side of the substrate, and in 80 nm or more from the lower layer of the substrate side, the amount of the carbon atoms was 70 atomic % or more.

Accordingly, it has been found that, in the region of about from 10 to 20 nm of the lowermost layer (just above the substrate) of the carbon layer in the laminate of the invention, nanocrystalline diamond grains are formed to cut in or adhere to the surface of the substrate through ultrasonic treatment of nano-diamond grains given thereto, and amorphous $SiO_2$ is formed so as to fill the space of those grains.

In the structure of the laminate of the invention, the nanocrystalline diamond grains cutting into the surface of the substrate function as an anchor to reinforce the adhesiveness of the carbon layer to the substrate or to the adhesiveness-reinforcing layer; and the nanocrystalline diamond grains adhering to the surface of the substrate or to the surface of the adhesiveness-reinforcing layer function as carbon grains for contributing to the growth of the carbon layer. To that effect, the nanocrystalline diamond grains in the laminate of the invention exhibit the significant effect of promoting the growth of the carbon film and of enhancing the adhesiveness thereof.

Further, the adhering nanocrystalline diamond grains and the amorphous $SiO_2$ existing to fill the space between the grains function as a substance that inhibits the formation of impurities such as amorphous carbon and graphite which form along with the formation of the carbon grains in the grain boundary of the nanocrystalline diamond grains, in the grain boundary of the carbon grains and/or in the space between the carbon grains, and/or inhibits the growth of the carbon grains. Further, the amorphous $SiO_2$ takes an auxiliary function for enhancing the adhesiveness between the substrate and the carbon layer. In particular, according to the method of the invention, it is possible to deposit a carbon layer at an adhesiveness in some degree, on a substrate of iron, copper or the like, for which an adhesiveness-reinforcing layer is naturally effective for deposition of a carbon layer thereon at a high adhesiveness, even though an adhesiveness-reinforcing layer is not provided. This is because the amorphous $SiO_2$ assists the anchor effect of the nanocrystalline grains cutting into the substrate, therefore taking the function of more enhancing the adhesiveness of the carbon layer to the substrate.

Figure 14:
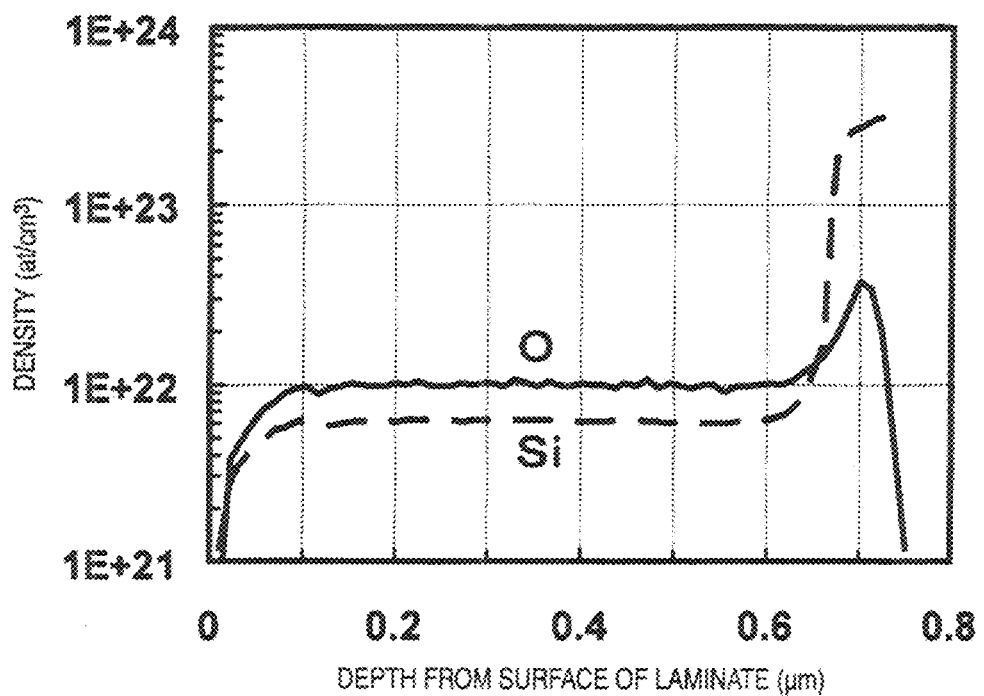
FIG. 14 It is a view showing the distribution in the depth direction of silicon (Si) and oxygen (O) contained in the carbon layer of a laminate comprising a silicon substrate and a carbon layer of the invention, in the depth direction of the film, as determined through secondary ion mass spectrometry.

For analyzing the distribution of the amorphous $SiO_2$ having the effect as above, in the carbon layer, the concentration of silicon and oxygen in the carbon layer and in the vicinity of the interface to the substrate was determined through secondary ion mass spectrometry (SIMS). FIG. 14 shows the distribution of silicon (Si) and oxygen (O) contained in the carbon layer of the laminate of the invention, in the depth direction of the film, as determined through SIMS. In this laminate, the substrate is Si. The thickness of the carbon layer was about 0.7 μm. From 14, it was known that both silicon and oxygen have a nearly constant concentration in the carbon layer. The concentration of silicon and oxygen in the center part and therearound of the thickness (0.37 μm) of the carbon layer was $6.17 \times 10^{21}/cm^3$ and $1.00 \times 10^{22}/cm^3$, respectively. Accordingly, the ratio between the concentration of silicon and that of oxygen is 1.23:2. This is because, as clarified in the above-mentioned film structure and elementary distribution analysis with a high-resolution transmitting electronic microscope and through electron energy loss spectrometry (EELS), $SiO_2$ exists in the surface of the carbon grains constituting the carbon layer in the laminate of the invention and is formed not only in such a manner that it surrounds the carbon grains but also some Si mixes into the carbon grains, and therefore, the ratio is deviated toward the direction in which the amount of silicon is larger than that of oxygen than the atomic number ratio between silicon and oxygen in $SiO_2$, 1:2. The film density is about $1.76 \times 10^{23}/cm^3$, and therefore the average concentration of $SiO_2$ in the carbon layer is about 3.5%.

On the other hand, in the vicinity of the lowermost layer (at around 0.7 μm as the depth from the surface of the laminate) on the silicon substrate side of the carbon layer in the laminate of the invention, the oxygen distribution has a peak. At a deeper part, the oxygen concentration is extremely small, and it can be seen that the part is inside the silicon substrate. As is obvious from the above-mentioned EELS analysis, oxygen exists as $SiO_2$ in the carbon layer. Accordingly, the SIMS analysis has clarified that, in the laminate of the invention, the $SiO_2$ concentration (amount per unit volume) is considerably larger in the vicinity of the lowermost layer on the silicon substrate side of the carbon layer than in the center part of the carbon layer. As estimated from the peak value in the oxygen distribution, $3.78 \times 10^{22}/cm^3$, the $SiO_2$ content in the lowermost layer of the carbon layer is about 21%. The above-mentioned film structure and elementary distribution analysis with a high-resolution transmitting electronic microscope and through electron energy loss spectrometry (EELS) has clarified that amorphous $SiO_2$ exists much in the lowermost layer of the carbon layer, and is distributed so that its concentration decreases toward the upper layer from the lower layer on the substrate side of the carbon layer; and the SIMS analysis also confirmed the same characteristic distribution.

The carbon layer of the laminate of the invention was observed through X-ray diffractiometry. The details of the measurement are described below.

The X-ray diffraction apparatus used is an X-ray diffractometer, RINT2100 XRD-DSC II manufactured by Rigaku Corporation, and the goniometer is a horizontal goniometer, Ultima III manufactured by Rigaku Corporation. A multi-purpose sample holder for thin film standard is attached to the goniometer. The sample analyzed herein is a carbon layer having a thickness of 500 nm, formed on a borosilicate glass substrate having a thickness of 1 mm according to the method mentioned in the above. A piece cut to have a size of 30 mm square along with the glass substrate was analyzed. The X-ray used is copper (Cu) $K\alpha_1$ ray. The voltage and the current applied to the X-ray tube were 40 kV and 40 mA. A scintillation counter was used for the X-ray detector. At first, the scattering angle ($2\theta$ angle) was calibrated, using a silicon standard sample. Deviation of the $2\theta$ angle was +0.02° or less. Next, the test sample was set on the sample holder and the $2\theta$ angle was adjusted to 0°, that is, was adjusted such that under the conditions that X-ray directly enters to the detector, the X-ray incident direction and the sample surface could be in parallel to each other and one-half of the incident X-ray could be shielded by the sample. The goniometer was rotated from the state and X-rays were applied thereto at an angle of 0.5 degrees relative to the sample surface. The $2\theta$ angle was rotated in increments of 0.02 degree from 10 degrees to 90 degrees while fixing the incident angle, and the intensity of X-rays scattering from the sample at $2\theta$ angle for each of them was measured. The computer program used for the measurement is RINT2000/PC Software Windows® version manufactured by Rigaku Corporation.

Figure 16:
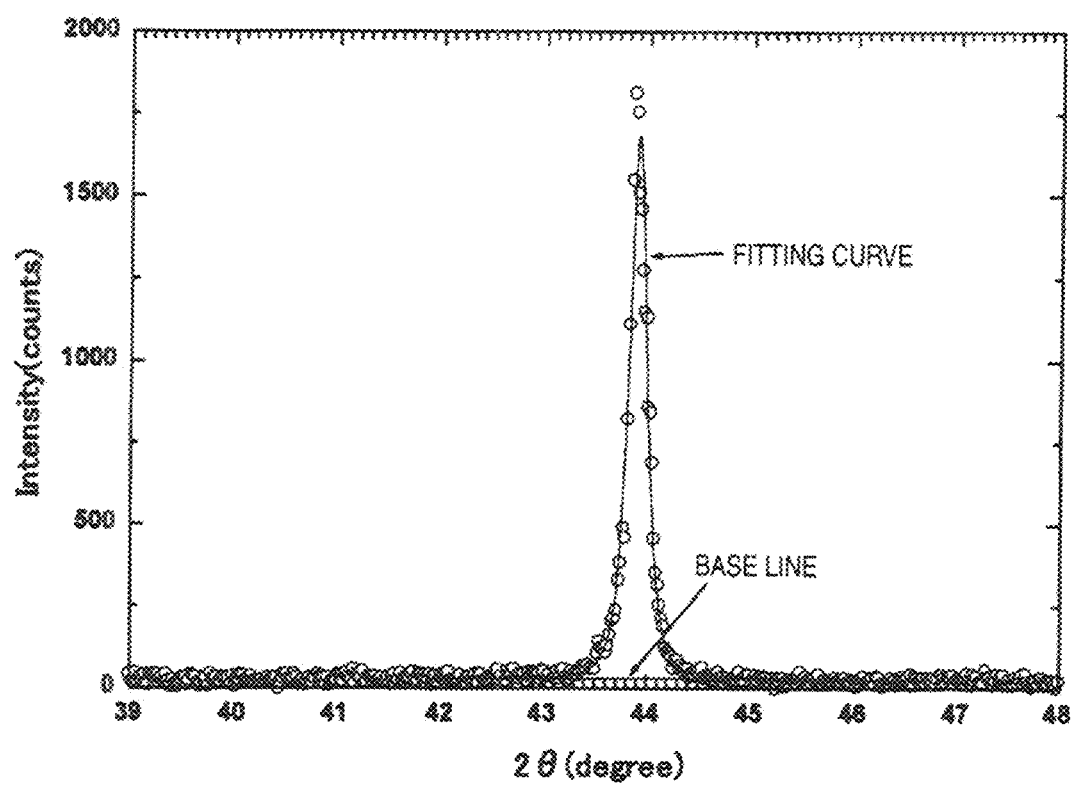
FIG. 16 It is a view showing a typical X-ray diffraction spectrum ((111) reflection peak) with CuK$_{\alpha 1}$ X-ray of diamond, and a peak fitting result.

FIG. 15 shows the measured X-ray diffraction spectrum. The circles in the graph are the measured points. It can be seen that a distinct peak is present at $2\theta$ of 43.9°. It is interesting, as can be seen from FIG. 15, that the peak at 43.9° has a shoulder at $2\theta$ of 41 to 42° on the lower angle side thereof (for "shoulder" of the spectrum, refer to "Kagaku Daijiten" (Tokyo Kagaku Dojin)). Accordingly, the peak comprises a two-component peak having a peak (first peak) at about 43.9° as the center and another peak (second peak) distributed at about 41 to 42°. In X-ray diffraction with $CuK_{\alpha 1}$ rays, diamond has been known as a carbonaceous substance having a peak at $2\theta$ of 43.9. FIG. 16 is a spectrum measured for diamond by X-ray diffraction in the same method, and the peak is attributable to (111) reflection of diamond. The difference in the X-ray diffraction spectrum between the carbon layer of the laminate of the invention and diamond is clear, that the second peak distributed at about 41 to 42° appearing in the spectrum of the carbon layer of the laminate of the invention cannot be seen in diamond. As described above, the (111) reflection of diamond consists of the first component (only the first peak) at 43.9° as the center, in which a shoulder on the lower angle side as in the carbon layer of the laminate of the invention is not observed. Accordingly, the second peak distributed at about 41 to 42° observed in the spectrum of the carbon layer of the laminate of the invention is a peak inherent to the carbon layer of the laminate of the invention.

Further, it can be seen that the peak in the X-ray diffraction spectrum of the carbon layer of the laminate of the invention in FIG. 15 is much broadened as compared with the peak of diamond in FIG. 16. Generally, as the size of the grains constituting a film decreases, the width of the X-ray diffraction peak is widened more; and the size of the grains constituting the carbon layer of the laminate of the invention can be said to be extremely small. When the size of the carbon grains constituting the carbon layer of the laminate of the invention (average diameter) is estimated based on the width of the peak according to the Scherrer's formula usually used in X-ray diffraction, it was about 15 nm. For the Scherrer's formula, for example, refer to "Hakumaku Handbook, edited by the Japan Society for Promotion of Science, Thin Film 131st Committee, from Ohmu-sha Ltd., in 1983, p. 375".

Next, the details of the constitution of the peak (positions and strength for respective peak ingredients) are to be taken into consideration.

For determining the detailed constitution of the peak at $2\theta$ of 43.9° in the X-ray diffractiometry of the carbon layer of the laminate of the invention, the carbon layer was analyzed at $2\theta$ angle of from 39° to 48°, using peak fitting. For the first peak fitting, a function called as a Pearson VII function was used. The function is used most generally as representing the peak profile in diffractiometry such as X-ray diffractiometry of neutron diffractiometry. For the Pearson VII function, "Practice of Powdery X-ray Analysis—Introduction to Rietveld Method" (edited by the X-ray Analysis Study Conference of the Analytical Chemistry Society of Japan, Asakura Shoten) may be referred to. As a result of study of various functions, it has been found that an asymmetric function is preferably used for the second peak fitting. In this case, an asymmetric normal distribution function (Gaussian distribution function) was used. The function is a normal distribution function having separate dispersion (standard deviation) values on the right and the left of the peak position, which is one of the simplest functions as a function used for asymmetric peak fitting, and could fit to the peak extremely favorably. A linear function (primary function) was used as the base line (background) function.

While various computer programs can be utilized in actual fitting operation, ORIGIN version 6, peak fitting module Japanese edition (hereinafter as ORIGIN-PFM) was used herein. In ORIGIN-PFM, the Pearson VII function is represented by "Pearson 7", the asymmetric normal distribution function is represented by "BiGauss", and the linear function is represented by "Line". The fitting completion condition is defined such that the correlation coefficient representing the fitting reliability ("COR", or "Corr Coef" in ORIGIN-PFM) is 0.99 or more.

According to the analysis using the peak fitting, as shown in FIG. 15, it can be seen that the measured spectrum can be approximated well as the sum for the first peak according to the Pearson VII function (fitting curve A in the graph), the second peak according to the asymmetric normal distribution function (fitting curve B in the graph) and the base line according to the primary function (background) (total fitting curve in the graph). In the measurement, the center of the fitting curve A is at $2\theta$ of 43.9°, while the fitting curve B has a maximum at 41.7°. The areas surrounded by the respective fitting curves and the base line are the respective peak intensities. Thus, the intensity of the second peak to the intensity of the first peak was analyzed. In the case of this sample, the intensity of the second peak (fitting curve B) was 45.8% of the intensity of the first peak (fitting curve A).

Many samples of the carbon layer of the laminate of the invention were analyzed for X-ray diffractiometry, and all the samples gave a broad peak, as seen in FIG. 15, at around the center of $2\theta$ of 43.9°. In addition, it has been found that it has a shape with a shoulder on the lower angle side as shown in FIG. 15, and comprises the first peak and the second peak. The X-ray diffractiometric spectra of many samples were analyzed through the similar peak fitting, and it has been found that the above-mentioned functions may bring about extremely good fitting. The center of the first peak was at $2\theta$ of 43.9±0.3°. In addition, it has been found that the second peak has a maximum at $2\theta$ of 41.7±0.5°. The intensity ratio to the first peak was at least 5% and at most 90%. The intensity ratio greatly depends on the production temperature, and it tended to be higher when the temperature is lower. On the other hand, the peak position was substantially constant irrespective of the production temperature.

What is to be noted for the analysis method of X-ray diffractiometry is that, when the intensity of the X-ray is smaller, then the measurement data scatter greatly and no reliable fitting is possible. Accordingly, the above-mentioned fitting analysis is necessary for those having a maximum peak intensity of 5000 counts or more.

As described above, it has been found that the carbon layer of the laminate of the invention has a broad peak at around the center of $2\theta$ of 43.9° in X-ray diffractiometry with $CuK\alpha_1$ rays, and that the peak has a structure with a shoulder on the lower angle side. It has been found through the peak fitting analysis that the peak could be approximated well by superimposing the first peak using the Pearson VII function having a center at $2\theta$ of 43.9°, the second peak using the asymmetric normal distribution function being the maximum at 41.7°, and the base line with the primary function (background).

The same peak fitting analysis was applied to the spectrum of diamond in FIG. 16. It has been found that the peak could be approximated well only with the Pearson VII function having a center at $2\theta$ of 43.9° in the case of diamond, quite different from the carbon layer of the laminate of the invention described above. Accordingly, it has been found that the carbon layer of the laminate of the invention is a substance having a structure different from that of diamond.

The carbon layer of the laminate of the invention is characterized in that it gives the above-mentioned second peak, and the carbon layer has a structure different from that of diamond. The production process for the carbon layer of the laminate of the invention and other data found through measurement were taken into consideration, and the structure of the layer was investigated. The production method for the carbon layer used in the invention has the following remarkable feature when compared with the CVD production method for diamond. First, while usual diamond production is conducted at a temperature 700° C. or more, the carbon layer of the laminate of the invention is produced at an extremely low temperature. Further, for decreasing the grain size of a diamond film, heretofore employed is a method of high-speed growth at a high concentration of the carbon source contained in the starting gas of around 10 mol % (molar ratio of methane gas). However, in the invention, the concentration of the carbon source is around 1 mol % and is considerably low. Specifically, in the method of the invention, carbon grains are deposited to form a film at a low temperature extremely slowly, taking a lot of time. Accordingly, the carbon grains are deposited at a breaking situation where they are transformed to diamond or not. Accordingly, a force of promoting deposition of hexagonal phase diamond which is a carbon crystal more stable than the usual cubic phase diamond or deposition of further stable graphite acts, and this is extremely unstable as the state of crystal deposition. Further, the once deposited graphite and amorphous carbonaceous substance are also removed through etching with a large quantity of hydrogen plasmas contained in the starting gas. The deposition mechanism gives a structure in which cubic phase diamond and hexagonal phase diamond are mixed, and the portions removed through etching remain as defects at an extremely high concentration therein. The defects are point defects such as atomic vacancy, linear defects such as dislocation, or surface-scale defects such as lamination defects, and the structure may contain large quantities of those defects. Accordingly, the structure is formed in which the X-ray diffraction peak at 43.9° has a shoulder on the lower angle side.

However, the feature of the X-ray diffraction peak described above is in association with the high function of the carbon layer of the laminate of the invention. Specifically, due to the production at a low carbon source concentration and at a low speed, therefore, etching of substances having a relatively low hardness such as graphite and graphite-like substances is promoted. Accordingly, it has a structure with high-concentration defects, but on the other hand, the carbon layer realizes a high hardness, therefore bringing about the extremely important characteristic feature of the laminate of the invention to express high-level polishing and grinding capabilities.

While cubic phase diamond and hexagonal phase diamond are mixed in the carbon layer and contain high-concentration defects therein, as produced at low temperatures, the layer can be laminated onto a substrate of iron and iron-base alloy, aluminium, copper, plastic or the like, owing to the advantage of such low-temperature production. In case where the production temperature in CVD treatment is high, the substrate may shrink more than the carbon layer when the laminate is restored to room temperature after the CVD treatment, owing to the difference in the thermal expansion between the substrate and the carbon layer, therefore resulting in that the carbon layer may peel away from the substrate owing to the great residual stress in the carbon layer. According to the method of the invention, the residual stress is small owing to low-temperature production, and therefore the adhesiveness of the carbon layer to the substrate is large. Further, in the carbon layer of the laminate of the invention, the carbon grains are fine and have a uniform grain size, and therefore the thermal strain is extremely small. Specifically, having the structure in which cubic phase diamond and hexagonal phase diamond are mixed and which contains extremely high-concentration defects therein, the thermal strain is relaxed and the layer has realized the high adhesiveness to the substrate. The above-mentioned characteristic feature has brought about the high polishing and grinding capabilities of the laminate of the invention.

The surface of the carbon layer of the laminate of the invention was observed with an atomic force microscope (AFM) to evaluate the surface roughness thereof. In this case, in order to minimize as much as possible the influence of the surface roughness of the substrate on the surface roughness of the layer, a carbon layer was formed on a quartz disc substrate (diameter 10 mm×thickness 3 mm) having a mirror-polished surface and having a small surface roughness (mathematical average height Ra=0.9 to 1.2 nm) to prepare a test sample. The AFM apparatus used was Nanoscope, scanning probe microscope manufactured by US Digital Instruments Inc.; and as the cantilever, used was Tap 300, a single crystal silicon-made rotation probe cantilever for scanning probe microscopes manufactured by Veeco Instruments Inc. In the measurement, used was a tapping mode, and the sample was observed in a scanning size of 1 μm×1 μm and at a scanning rate of 1.0 Hz.

Figure 17:
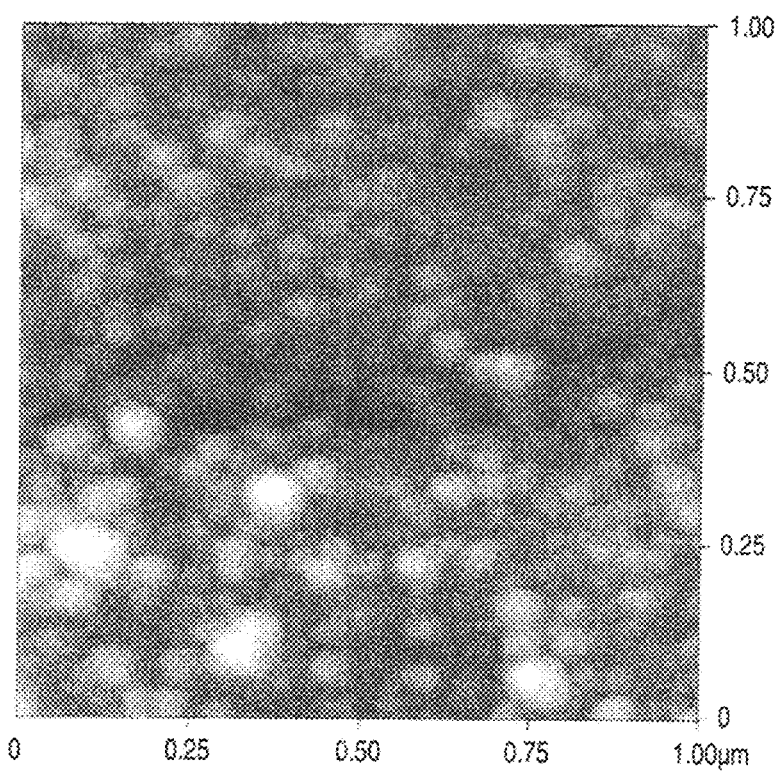
FIG. 17 It is a surface of the carbon layer of a laminate of the invention comprising a quartz substrate (average surface roughness Ra=0.87 nm) and a carbon layer (thickness 1.6 μm), as observed with an atomic force microscope (AFM).

FIG. 17 shows the observation result of the surface of a carbon layer of a laminate of the invention, as observed with an atomic force microscope (AFM). For the image processing and the surface roughness evaluation of the observation result, used was Nanoscope IIIa ver. 4.43r8, a measurement and analysis computer software of AFM apparatus standard. From the analysis of the observation result, it was confirmed that the surface roughness of the carbon layer was Ra of 3.1 nm. Many other samples were also evaluated. It was confirmed that the surface roughness Ra falls within a range of from 2.6 to 20 nm, through varying depending on the carbon layer deposition condition. The surface roughness of the quartz disc substrate before carbon layer deposition thereon was also measured, and it was confirmed that Ra falls within a range of from 0.9 to 1.2 nm.

The mathematical average height Ra is described in detail, for example, in "JIS B 0601-2001" or "ISO 4287-1997".

It has been clarified that, in polishing a diamond single crystal and in polishing a sapphire single crystal with the laminate of the invention, the surface roughness of the laminate has a close relation to the polishing speed and the roughness of the finished surface. Specifically, when the surface roughness of the laminate is small, then the roughness of the finished surface of the polished substance may be small, therefore, the polished substance may have an extremely planar finished surface; while on the other hand, the polishing speed is low. On the contrary, when the surface roughness of the laminate is large, then the polishing speed may be large, but the finished surface roughness of the polished substance may be large, and the polished substance could hardly have a planar surface. This may be considered because the surface roughness of the laminate may depend on the polishing resistance, that is, the friction coefficient. Accordingly, the relationship between the surface roughness Ra of a laminate of the invention having a glass substrate and the friction coefficient was investigated.

Figure 18:
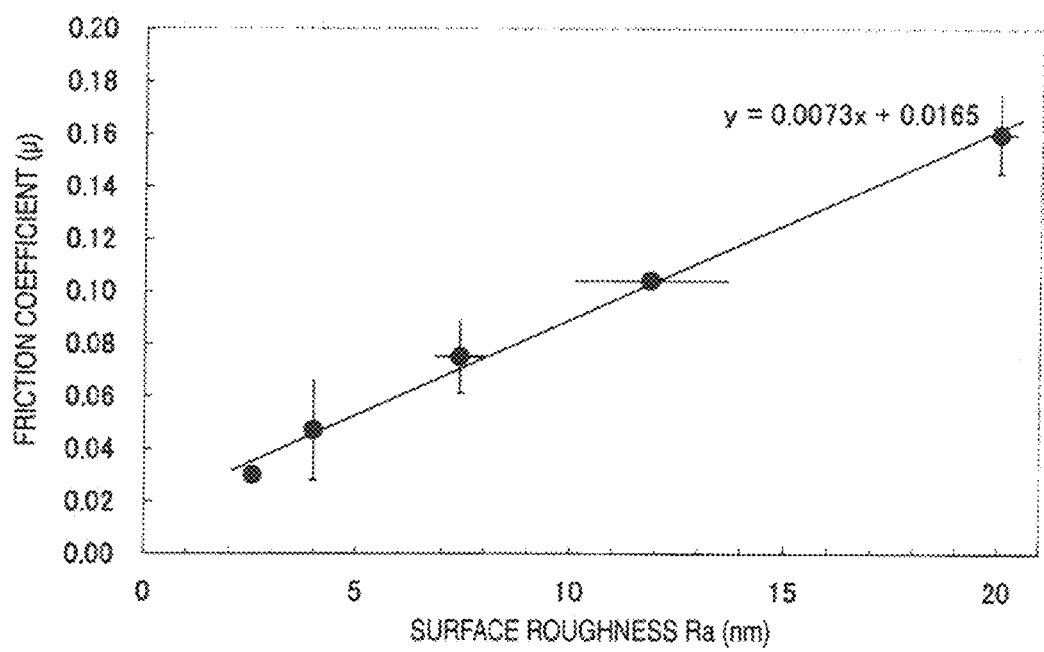
FIG. 18 It is a view showing the relationship between the surface roughness Ra and the friction coefficient μ of a laminate of the invention.

FIG. 18 shows the measurement result. The linear line in the drawing is an approximate line of the measured points; and the numerical formula in the drawing is an approximate formula indicating the relationship between the surface roughness (x) and the friction coefficient (y). The friction coefficient was determined under the condition mentioned below, using variable normal load friction and wear measurement system (HSS2000) manufactured by Shinto Scientific Co., Ltd., and was analyzed using an analysis software (TriboWare Rev. 1.8).

Test Condition: reciprocation test
Load: 2.0 N
Friction material: SUS440C ball having a diameter of 4.7 mm
Oil lubrication: at room temperature, in base oil
Moving speed: 20 nm/sec Thus obtained, the relationship between the surface roughness and the friction coefficient, and the polishing test result were investigated and, as a result, it has been clarified that, when the friction coefficient is smaller than 0.05, then the polishing speed is extremely small and practicable precision polishing is almost impossible, and that, when the friction coefficient is larger than 0.10, then precision polishing is impossible enough to give a surface roughness Ra of 0.5 nm or less.

Accordingly, as in FIG. 18, the surface roughness Ra of the laminate that enables practicable precision polishing is within a range of from 4 nm to 11 nm within which the friction coefficient could be from 0.05 or more and 0.10 or less.

As described above, since the surface roughness of the laminate has a significant influence on the polishing characteristic thereof, a method of controlling the surface roughness of the laminate is needed. In particular, in case where Ra of the surface of the laminate is larger than 11 nm, it is desirable to control Ra so as to fall within a range of from 4 nm to 11 nm that enables practicable precision polishing, by reducing the surface roughness of the laminate.

It has been found that, in the invention, after the laminate has been produced through CVD treatment, it may be polished with the other laminate produced in the same manner to thereby reduce the surface roughness of the laminate. In this case, pure water or ethanol was dropped onto the surfaces of both laminates, and using it as a lubricant material, the two substrates were rubbed to each other in a mode of reciprocating motion, rotary motion or eccentric rotary motion.

As a result of assiduous studies, it has been further found that, in the invention, after the laminate has been produced through CVD treatment, the surface of the deposited film can be exposed to hydrogen plasma using the same apparatus to thereby control the surface roughness of the laminate. Concretely, a hydrogen plasma is generated with 100 mol % hydrogen gas under a gas pressure of from 1 to 100 Pa, preferably from 1 to 50 Pa, and the CVD-processed laminate surface is exposed to the plasma for 30 seconds to 5 minutes, preferably for 1 to 3 minutes, whereby the surface roughness of the laminate can be reduced.

For confirming the effect of the surface roughness reduction by the above-mentioned polishing and hydrogen plasma, laminates having a silicon single crystal wafer as the substrate were evaluated in point of the surface roughness thereof before and after the treatment. For the surface roughness evaluation, used were a surface profile analyzer SURF-CORDER ET-4300 and a surface microstructure analysis software iSTAR31 Version 6.72 manufactured by Kosaka Laboratories. In the measurement and analysis, the cut-off value was 0.8 mm, the standard length was 4.0 mm and the test length was 4.0 mm. The results are shown in FIG. 19 to FIG. 22.

Figure 19:
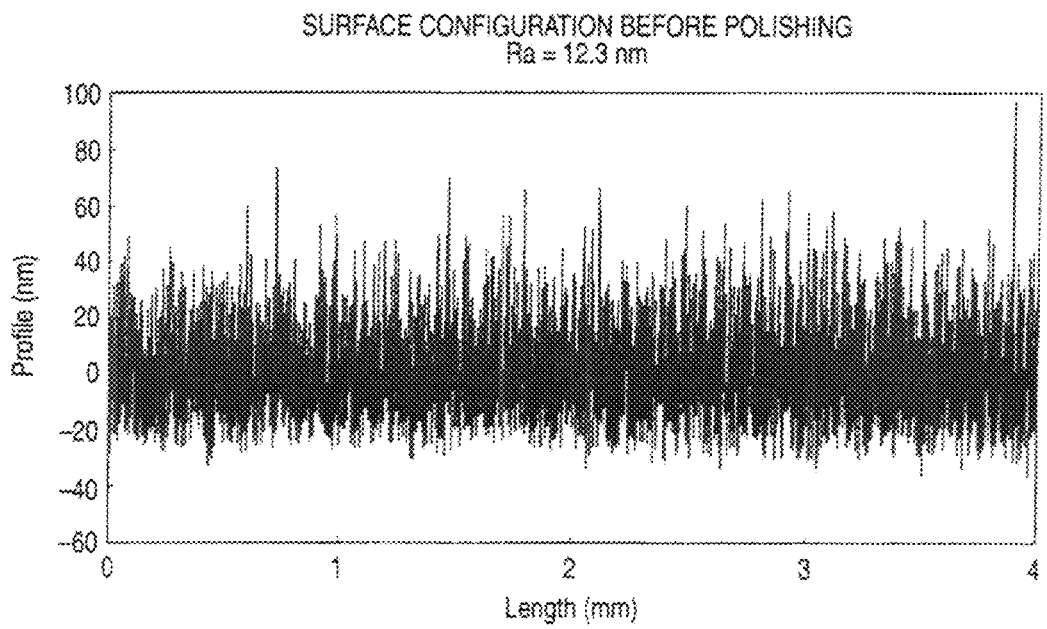
FIG. 19 It is a view showing the measurement data of the surface configuration of a laminate of the invention.

FIG. 19 is a view showing the measurement data of the surface configuration of the laminate just after CVD treatment, in which the surface roughness Ra was evaluated to be 12.3 nm.

Figure 20:
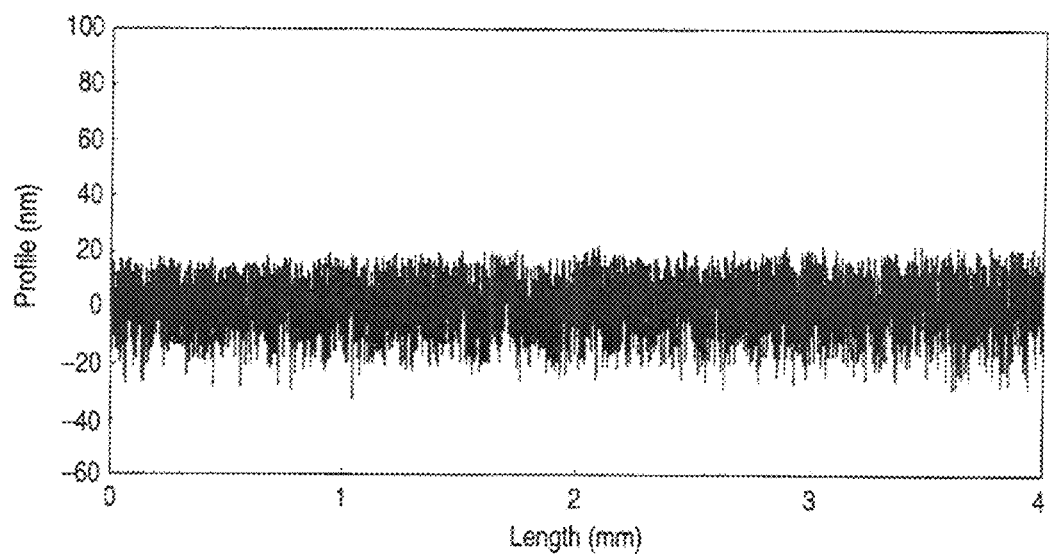
FIG. 20 It is a view showing the measurement data of the surface configuration of a laminate of the invention of which the surface was rubbed with another laminate of the invention.

The surface of the laminate was rubbed with the same other laminate for about 1 minute, for 100 linear reciprocating motions and additional 100 reciprocating motions in the direction perpendicular to the former rubbing, all at an amplitude of about 10 mm. FIG. 20 shows the result of the surface configuration measurement of the thus-rubbed laminate. In this case, pure water was used as a lubricant material. The surface roughness Ra obtained from FIG. 20 is 8.2 nm, which obviously confirms the reduction in the surface roughness.

Figure 21:
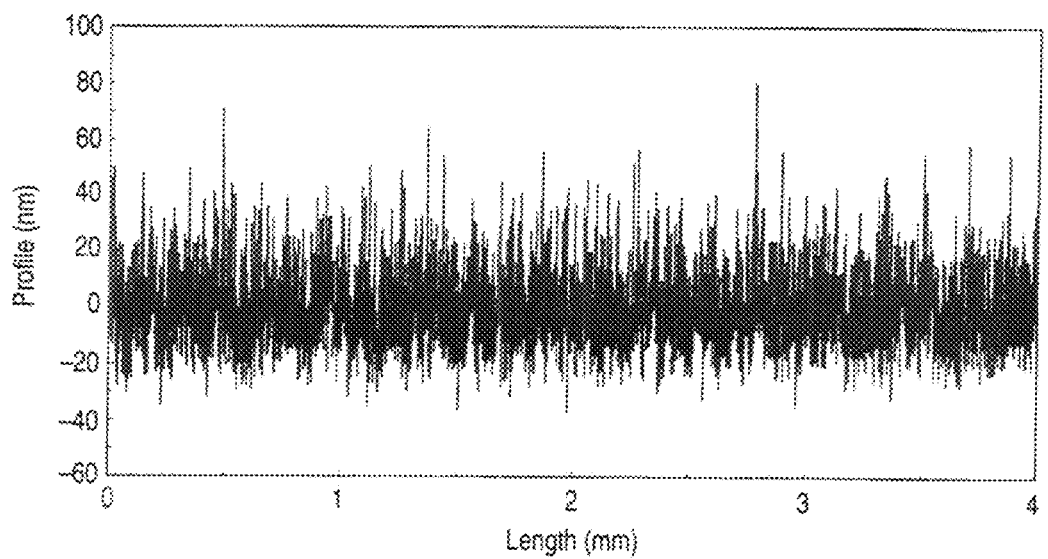
FIG. 21 It is a view showing the measurement data of the surface configuration of a laminate of the invention just after CVD treatment.

FIG. 21 shows the measurement data of the surface configuration of the laminate just after CVD treatment. In this case, the surface roughness Ra was 10.3 nm.

FIG. 22 shows the measurement data of the surface configuration of the laminate produced through the same CVD treatment as that for the laminate of FIG. 21, followed by exposure to hydrogen plasma for 3 minutes after the CVD treatment. The hydrogen plasma treatment was conducted with 100 mol % hydrogen gas under a gas pressure of 20 Pa. The surface roughness Ra evaluated in FIG. 22 is 5.0 nm, and also in this case, the surface roughness reduction was obviously confirmed.

It has been found that, when any of the above-mentioned polishing and hydrogen plasma treatment is applied to a laminate having a surface roughness Ra of more than 11 nm and unsuitable to precision polishing, the surface roughness Ra of the laminate may be reduced to from 4 to 11 nm enough for precision polishing.

[Example of Polishing of Diamond Single Crystal]

A laminate of the invention was tested for polishing the surface of single crystal diamond. As the substrate of the laminate, used was a borosilicate glass disc having a diameter of 100 mm and a thickness of 1 mm. Nanocrystalline diamond grains were provided in the surface through ultrasonic treatment, and a carbon layer having a thickness of about 1 μm was deposited thereon through the above-mentioned CVD treatment, thereby producing a laminate. This was used as a polishing plate. The polishing apparatus used in the test was MA-200 Model manufactured by Musashino Electronics. On an aluminium alloy-made polishing table coated with Teflon, the laminate disc was fixed with a double-adhesive tape.

The sample used in the polishing test was a high-temperature high-pressure produced Ib-type single crystal diamond substrate (trade name, SumiCrystal) manufactured by Sumitomo Electric Industry, having a size of 3 mm square and a thickness of 0.5 mm. The surface of the sample was previously polished in a mode of scaife polishing with diamond abrasive grains. The surface is (100) plane. In observation of the surface configuration in a region of 1 μm square with an atomic force microscope, the surface roughness Ra was 1.0 nm. The atomic force microscope apparatus used for the observation was a scanning probe microscope, DI 3100 Model by Digital Instrument Inc. Ra is an mathematical average height, which is described in detail, for example, in "JIS B 0601-2001" or "ISO 4287-1997".

Three single crystal diamond substrates were stuck to the surface of an aluminium alloy-made columnar sample holder having a diameter of 5 cm and a thickness of 4.5 cm, using a shift wax NIKKA 6507F. The three samples on the sample holder were so placed that they were at an interval of 120 degrees on the circumference of a circle having a radius of 20 mm from the center of the holder surface. A spindle having a weight of 500 g was put on the holder, and the load to the single crystal diamond substrate surface being polished was 2733 g/cm$^2$.

With tap water being dropped onto the polishing plate in an amount of 3 cc/min, the polishing plate was rotated at 130 rpm to polish the surface of the single crystal diamond substrate. In this case, the system was so planned that the sample holder to which the single crystal diamond substrates were stuck could rotate and revolute in accordance with the rotation of the polishing plate, and nearly the entire surface of the laminate fixed to the polishing plate was used to polish. After polished for about 1 hour, the polished single crystal diamond substrate surface was observed with an optical microscope and an atomic force microscope.

FIG. 23A and FIG. 23B show optical microscopic images of the surface of the single crystal diamond substrate, taken before and after polishing. In the optical microscopic image before polishing shown in FIG. 23A, many streaks in the vertical direction are seen. These are scuff marks made in scaife polishing. On the other hand, in the surface polished with the laminate of the invention shown in FIG. 23B, there are seen no scuff marks that had been seen before polishing. In that manner, as a result of polishing with the laminate of the invention, the scuff marks made in scaife polishing were completely removed, and it is obvious that the invention gave a surface having a higher planarity than that given by scaife polishing.

The single crystal diamond substrate surface polished with the laminate of the invention was observed with an atomic force microscope. As a result, the surface roughness Ra was 0.17 nm. Before polishing, Ra was 1 nm, and it is understood that, as a result of polishing with the laminate of the invention, the planarity of the single crystal diamond substrate surface was significantly increased.

The laminate comprising a carbon layer formed on a glass substrate according to the production method of the invention makes it possible to polish the surface of a single crystal diamond substrate with high precision, not using at all diamond abrasive grains required in a conventional method of scaife polishing but merely using water secondarily, as so described in the above. Accordingly, it has been understood that the laminate comprising a carbon layer formed on a glass substrate according to the production method of the invention has a function of a quite novel and extremely excellent polishing material.

When the laminate comprising the glass substrate and the carbon layer of the invention is used for polishing single crystal diamond, the carbon layer of the laminate is gradually worn and reduced. Finally, the laminate could not exhibit its polishing capability since the carbon layer has been worn away. The laminate comprising the glass substrate and the carbon layer of the invention is so planed that the proportion of amorphous $SiO_2$ in the region of about from 10 to 20 nm of the lowermost layer of the carbon layer therein is about 50 atomic % or more, that the amount of amorphous $SiO_2$ gradually decreases toward the upper layer from the lower layer on the substrate side of the carbon layer, and that in 80 nm or more from the lower layer on the substrate side, the carbon grains account for 70 atomic % or more. During polishing, the thickness decreases as the carbon layer is worn away, and when the thickness has reached such that the proportion of the carbon grains is 70 atomic % or less, the laminate of the invention could no more exhibit its excellent polishing capability. Accordingly, it has been known that, in the laminate comprising a glass substrate and a carbon layer of the invention, the part of 80 nm or more from the lower layer on the substrate side in which the proportion of the carbon grains is 70 atomic % or more is a layer effectively usable for polishing.

[Example of Polishing of Sapphire Single Crystal]

A laminate of the invention was tested for polishing the surface of single crystal sapphire. As the substrate, used was an aluminium alloy disc having a diameter of 150 mm and a thickness of 3 mm. First, nanocrystalline diamond grains were provided on the aluminium alloy surface through ultrasonic treatment, and a carbon layer having a thickness of about 1 μm was deposited thereon through the above-mentioned CVD treatment, thereby producing a laminate. However, the carbon layer had no adhesiveness at all to the aluminium alloy surface, and it peeled away merely when rubbed with fingers, and the laminate could not be used in a polishing test. Accordingly, an adhesiveness-reinforcing layer of titanium having a thickness of 1 μm was formed on the aluminium alloy surface according to a sputtering method. Then, nanocrystalline diamond grains were provided on the titanium film surface through ultrasonic treatment, and a carbon layer having a thickness of about 1 μm was deposited thereon through the above-mentioned CVD treatment, thereby producing a laminate. In case where the adhesiveness-reinforcing layer of titanium was on the aluminium alloy surface, the adhesiveness of the carbon layer thereto increased greatly, and the laminate could be tried in the polishing test mentioned below. It has been clarified that, in case where an aluminium alloy is used as a substrate, a titanium film can function extremely effectively as the adhesiveness-reinforcing layer for increasing the adhesiveness of the carbon layer to the substrate.

The laminate comprising the aluminium alloy substrate, the adhesiveness-reinforcing layer of titanium formed thereon and the carbon layer was used as a polishing plate in the polishing test. The polishing apparatus used in the test was MA-200 Model manufactured by Musashino Electronics. On an aluminium alloy-made polishing plate coated with Teflon, the laminate disc was fixed with a double-adhesive tape.

The sample used in the polishing test was a single crystal sapphire substrate manufactured by Dalian Danning Optoelecronics Technology Co., Ltd., having a size of 10 mm square and a thickness of 0.5 mm, and its crystal face was C plane. Before polished, the surface of the sample was semitransparent and frosted. In observation of the surface configuration in a region of 1 μm square with an atomic force microscope, the surface roughness Ra was about 23 nm, before polished.

Three single crystal sapphire substrates were stuck to the surface of an aluminium alloy-made columnar sample holder having a diameter of 5 cm and a thickness of 4.5 cm, using a shift wax NIKKA 6507F. The three samples on the sample holder were so placed that they were at an interval of 120 degrees on the circumference of a circle having a radius of 20 mm from the center of the holder surface. A spindle having a weight of 500 g was put on the holder and the load to the single crystal sapphire substrate surface being polished was 80 g/cm².

With tap water being dropped onto the polishing plate in an amount of 3 cc/min, the polishing plate was rotated at 20 rpm to polish the surface of the single crystal sapphire substrate. In this case, the system was so planned that the sample holder to which the single crystal sapphire substrates were stuck could rotate and revolute in accordance with the rotation of the polishing plate, and nearly the entire surface of the laminate fixed to the polishing plate was used to polish. After polished for about 1 hour, it was visually confirmed that the surface which had been frosted and nontransparent before polished was entirely polished into a transparent surface. In addition, the polished single crystal sapphire substrate surface was observed with an optical microscope and an atomic force microscope.

FIG. 24A and FIG. 24B show optical microscopic images of the surface of the single crystal sapphire substrate, taken before and after polishing. Before polishing, the surface was frosted and nontransparent and, as in FIG. 24(a), innumerable unevenness were observed therein with a microscope. On the other hand, in the surface polished with the laminate of the invention comprising the aluminium alloy substrate and the adhesiveness-reinforcing layer of titanium formed thereon and the carbon layer, there are seen no unevenness that had been seen innumerably before polishing and the polished surface had a high-level planarity, as in FIG. 24B.

The single crystal sapphire substrate surface polished with the laminate of the invention comprising the aluminium alloy substrate and the adhesiveness-reinforcing layer of titanium formed thereon and the carbon layer was observed with an atomic force microscope. As a result, the surface roughness Ra after polishing was 0.320 nm. Before polishing, Ra was about 23 nm, and it is understood that, as a result of polishing with the laminate of the invention comprising the aluminium alloy substrate and the adhesiveness-reinforcing layer of titanium formed thereon and the carbon layer, the planarity of the single crystal sapphire substrate surface was significantly increased.

What is to be noted for the polishing of the sapphire single crystal substrate described in the above is as follows. In this Example, the surface roughness Ra of the single crystal sapphire substrate before polishing is about 23 nm and the substrate has an extremely rough surface. In case where such a rough surface is polished up to a surface roughness of 1 nm or less according to a conventional method, it requires a grinding (roughly polishing) step of using a slurry containing diamond abrasive grains having a large grain size of about 10 μm. Generally, the subsequent processes is such a process with diamond abrasive grains with stepwise reducing the grain size thereof to thereby reduce the surface roughness to increase the surface planarity. For finally attaining the planarity in the order of a few nm or less, a final polishing step of "chemical-mechanical polishing" using an alkali slurry or the like and comprising nanometer-scale mechanical removing with ultrafine abrasive grains and chemical dissolution with a processing liquid having an etching effect as combined could satisfy the necessary precision level. However, according to the polishing with the laminate of the invention comprising the aluminium alloy substrate and the adhesiveness-reinforcing layer of titanium formed thereon and the carbon layer, it was possible to polish the surface of a single crystal sapphire substrate with extremely high planarity, not using at all an alkali slurry or the like required in a conventional method but merely using water secondarily, as so described in the above. From the above, it is obvious that the laminate of the invention comprising the aluminium alloy substrate and the adhesiveness-reinforcing layer of titanium formed thereon and the carbon layer has the function of from the roughly polishing grinding step to the finally finishing polishing step.

As in the above, it has been understood that the laminate of the invention comprising the aluminium alloy substrate and the adhesiveness-reinforcing layer of titanium formed thereon and the carbon layer is a quite novel and extremely excellent grinding material and, at the same time, has the function of a polishing material.

When the laminate of the invention comprising the aluminium alloy substrate and the adhesiveness-reinforcing layer of titanium formed thereon and the carbon layer is used in grinding and polishing the single crystal sapphire substrate, the carbon layer of the laminate is gradually worn and reduced. Finally, the laminate could not exhibit its grinding and polishing capability since the carbon layer has been worn away. The laminate of the invention comprising the aluminium alloy substrate and the adhesiveness-reinforcing layer of titanium formed thereon and the carbon layer is so planed that the proportion of amorphous $SiO_2$ in the region of about from 10 to 20 nm of the lowermost layer of the carbon layer therein is about 50 atomic % or more, that the amount of amorphous $SiO_2$ gradually decreases toward the upper layer from the lower layer on the substrate side of the carbon layer, and that in 80 nm or more from the lower layer on the substrate side, the carbon grains account for 70 atomic % or more. During grinding and polishing, the thickness of the laminate decreases as the carbon layer is worn away, and when the thickness has reached such that the proportion of the carbon grains is 70 atomic % or less, the laminate of the invention could no more exhibit its excellent grinding and polishing capability. Accordingly, it has been known that, in the laminate of the invention comprising the aluminium alloy substrate and the adhesiveness-reinforcing layer of titanium formed thereon and the carbon layer, the part of at least 80 nm or more from the lower layer on the substrate side in which the proportion of the carbon grains is 70 atomic % or more is a layer effectively usable for grinding and polishing.

When the single crystal sapphire substrate was polished with the laminate comprising a carbon layer formed on a glass substrate according to the production method of the invention, the extremely rough frosted surface thereof could be polished to have a surface having a high planarity of Ra of 0.3 nm, quite similarly to the above. Accordingly, it has been understood that the laminate comprising a carbon layer formed on a glass substrate according to the production method of the invention is a quite novel and extremely excellent grinding material and, at the same time, has the function of a polishing material.

The above experiments have clarified that the laminate of the invention having a characteristic constitution of such that the proportion of amorphous $SiO_2$ in the region of about from 10 to 20 nm of the lowermost layer of the carbon layer therein is about 50 atomic % or more, that the amount of amorphous $SiO_2$ gradually decreases toward the upper layer from the lower layer on the substrate side of the carbon layer, and that in 80 nm or more from the lower layer on the substrate side, the carbon grains account for 70 atomic % or more can exhibit an excellent function not only as a polishing material but also as a grinding material.

The advantages of the above-mentioned excellent grinding and polishing function that the laminate of the invention has are described. As a result of assiduous studies about a laminate comprising a substrate or a substrate provided with an adhesiveness-reinforcing layer, and a carbon layer, the inventors have found the laminate structures shown in FIG. 1 to FIG. 4, and have made it possible to form a carbon layer having a high hardness and good surface planarity and additionally having good adhesiveness to substrates described in detail hereinunder.

In the laminate of the invention comprising the glass substrate and the carbon layer, the adhesion strength of the carbon layer to the substrate was measured. The apparatus used for the measurement and the measurement condition are as follows.

Apparatus for measurement: Ultra-thin film scratch tester Model CSR-2000 manufactured by Rhesca (This apparatus satisfies Japanese Industrial Standards, JIS R-3255.)
Condition for Measurement:
   Scratch speed: 10 mm/sec
   Spring constant: 100 g/mm
   Radius of curvature of presser: R25 mm
   Load applying speed: 2.5 mN/sec
   Excitation level: 100 mm (This means the scratch width (x-direction).)
   Excitation frequency: 32 Hz
   Japanese Industrial Standards (JIS) specifies the standards for scratch test, in which the adhesion strength (adhesion force) of a film is indicated by the critical damage load and the complete damage load to the film. In this measurement, the complete damage load is designated as the adhesion strength.

In the laminate of the invention comprising the glass substrate and the carbon layer, the adhesion strength of the carbon layer to the substrate was at least 98.4 mN and was extremely high. Even the laminate having the smallest adhesion strength could polish a single crystal diamond substrate. In the laminate of the invention comprising the glass substrate and the carbon layer, the maximum adhesion strength was 277.5 mN.

Naturally, the laminate having the largest adhesion strength could polish a single crystal diamond substrate.

In the laminate comprising the aluminium alloy substrate and the adhesiveness-reinforcing layer of titanium formed thereon and the carbon layer, the adhesion strength of the carbon layer to the titanium surface of the adhesiveness-reinforcing layer was measured. The apparatus used for the measurement and the measurement condition are the same as those in the above-mentioned case using the glass substrate.

In the laminate of the invention comprising the aluminium alloy substrate and the adhesiveness-reinforcing layer of titanium formed thereon and the carbon layer, the adhesion strength of the carbon layer to the titanium surface of the adhesiveness-reinforcing layer was at least 29.5 mN and was extremely high. Even the laminate having the smallest adhesion strength could grind and polish a single crystal sapphire substrate. In the laminate of the invention comprising the aluminium alloy substrate and the adhesiveness-reinforcing layer of titanium formed thereon and the carbon layer, the maximum adhesion strength was 95.1 mN. Naturally, the laminate having the largest adhesion strength could grind and polish a single crystal diamond substrate.

The invention claimed is:

1. A laminate comprising
a substrate;
a carbon layer; and
an adhesiveness-reinforcing layer provided between the substrate and the carbon layer, the adhesiveness-reinforcing layer comprising a diamond fine grain which is crushed by impact given thereto, wherein the diamond fine grain adheres to or anchors cutting into a surface of the adhesiveness-reinforcing layer,
wherein
the substrate comprises any one of iron, iron-base alloy, stainless, aluminium, copper and plastic,
the adhesiveness-reinforcing layer comprises any one of titanium, titanium nitride, silicon carbide and silicon nitride,
the carbon layer comprises a carbon grain; and a formation/growth inhibiting material that inhibits the formation of an impurity inhibiting the growth of the carbon grain and/or inhibits the growth of the carbon grain,
an amount of the formation/growth inhibiting material decreases from a lower layer toward an upper layer on the adhesiveness-reinforcing layer side, and
the carbon layer includes 70 atomic % or more of the carbon grain in 80 nm or more from an upper surface of the adhesiveness-reinforcing layer side.

2. The laminate according to claim 1, wherein a density of the diamond fine grain is from $1 \times 10^9$ grains/cm$^2$ to $1 \times 10^{12}$ grains/cm$^2$.

3. The laminate according to claim 1, wherein the carbon layer has a spectrum peak at a Bragg's angle (2θ) of 43.9°±0.3° and of 41.7°±0.5° in an X-ray diffraction spectrum with CuK$_{\alpha 1}$ ray.

4. A polishing material comprising the laminate according to claim 1.

5. The laminate according to claim 1, wherein the formation/growth inhibiting material is a SiO$_2$ material or an Al$_2$O$_3$ material.

6. The laminate according to claim 1, wherein an amount of the amorphous SiO$_2$ layer is 50 atomic % or more in the region of 10 to 20 nm from the uppermost surface of the adhesiveness-reinforcing layer.

7. The polishing material according to claim 4, wherein an outermost surface of the carbon layer has a surface roughness Ra of from 4 to 11 nm, and a region where the carbon grain accounts for 70% or more of the carbon layer is a polishing layer.

8. A grinding material comprising the laminate according to claim 1.

* * * * *